US010758905B2

(12) United States Patent
Ai et al.

(10) Patent No.: US 10,758,905 B2
(45) Date of Patent: Sep. 1, 2020

(54) MICROFLUIDIC PARTICLE MANIPULATION

(71) Applicant: Singapore University of Technology and Design, Singapore (SG)

(72) Inventors: Ye Ai, Singapore (SG); David John Collins, Singapore (SG)

(73) Assignee: Singapore University of Technology and Design, Singapore (SG)

( * ) Notice: Subject to any disclaimer, the term of this patent is extended or adjusted under 35 U.S.C. 154(b) by 237 days.

(21) Appl. No.: 15/775,717

(22) PCT Filed: Nov. 11, 2016

(86) PCT No.: PCT/SG2016/050560
§ 371 (c)(1),
(2) Date: May 11, 2018

(87) PCT Pub. No.: WO2017/082828
PCT Pub. Date: May 18, 2017

(65) Prior Publication Data
US 2018/0369816 A1 Dec. 27, 2018

(30) Foreign Application Priority Data
Nov. 11, 2015 (SG) .......................... 10201509280Y

(51) Int. Cl.
*B01L 3/00* (2006.01)
*H01L 41/187* (2006.01)

(52) U.S. Cl.
CPC ... *B01L 3/502761* (2013.01); *B01L 3/502776* (2013.01); *H01L 41/187* (2013.01);
(Continued)

(58) Field of Classification Search
CPC ........ G01N 21/78; G01N 21/82; G01N 31/22; G01N 21/77
See application file for complete search history.

(56) References Cited

U.S. PATENT DOCUMENTS

| 6,776,176 B1* | 8/2004 | Kino ...................... G11B 7/122 134/184 |
| 2012/0145890 A1* | 6/2012 | Goodlett ............. H01J 49/0454 250/282 |
| 2014/0008307 A1* | 1/2014 | Guldiken .......... B01L 3/502761 210/748.05 |

OTHER PUBLICATIONS

International Search Report and Written Opinion dated Jan. 26, 2017 in connection with PCT/SG2016/050560.
(Continued)

*Primary Examiner* — Jennifer Wecker
*Assistant Examiner* — Michael Paul Shimek
(74) *Attorney, Agent, or Firm* — Wolf, Greenfield & Sacks, P.C.

(57) ABSTRACT

The present invention relates to the use of acoustic waves for the manipulation and sorting of particles and cells. In an embodiment, there is provided a microfluidic device for manipulating a particle in a fluid suspension, the device comprising: (a) a substrate; (b) a channel defined in the substrate, the channel having an inlet for receiving the fluid suspension and an outlet for discharging the fluid suspension; and (c) an acoustic source configured to deliver a travelling surface acoustic wave transverse the flow of the fluid suspension in the channel, wherein the acoustic source is an interdigital transducer (IDT), the IDT comprises a plurality of concentric circular arcs having a tapered end directed at the channel, and the tapered end has an aperture of between 4 μm and 150 μm. In an alternative embodiment, the device comprises a second channel disposed intermediate the first channel and the acoustic source wherein the first and second channels are connected by a pumping channel.

20 Claims, 9 Drawing Sheets

Figure 1:
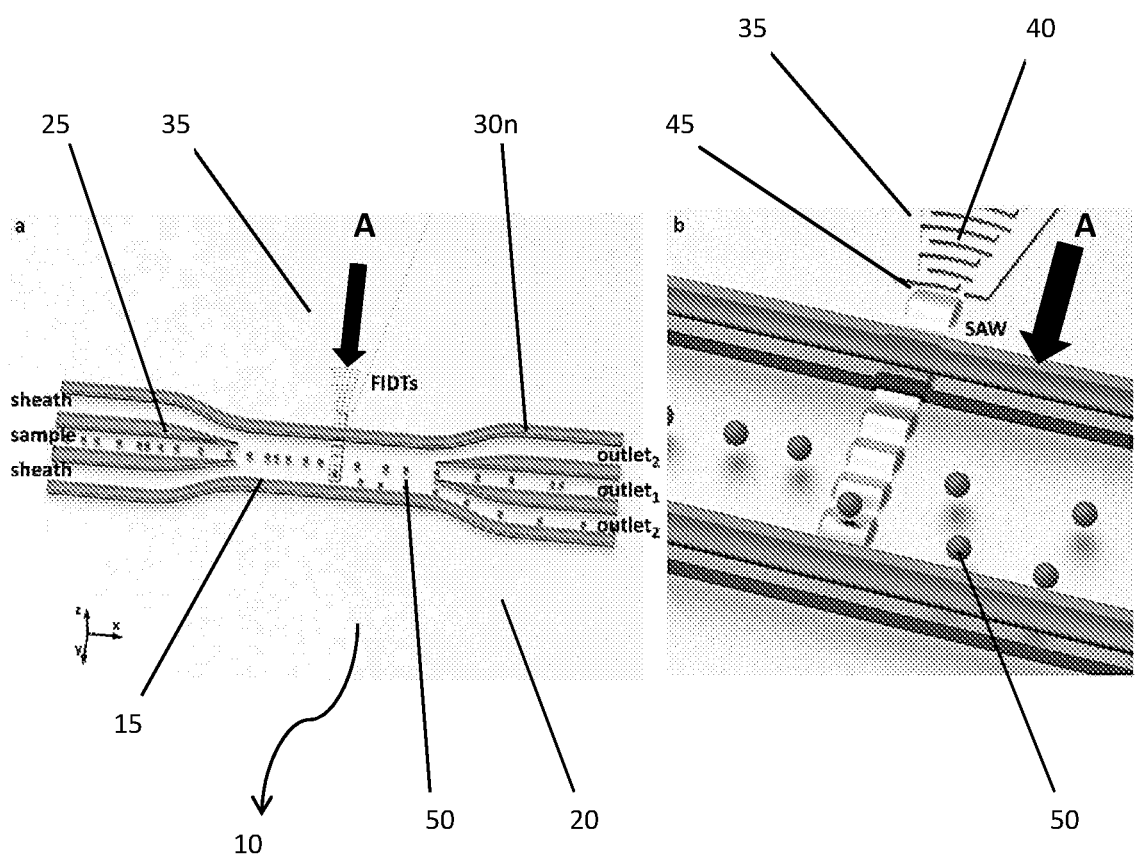

(52) U.S. Cl.
CPC .......... B01L 2200/0652 (2013.01); B01L 2300/0816 (2013.01); B01L 2300/0864 (2013.01); B01L 2400/0436 (2013.01)

(56) References Cited

OTHER PUBLICATIONS

Ai et al., Droplet translocation by focused surface acoustic waves. Microfluidics and Nanofluidics. Nov. 2012; 13(5):715-22. doi: 10.1007/s10404-012-0990-y.

Collins et al., Highly focused high-frequency travelling surface acoustic waves (SAW) for rapid single-particle sorting. Lab Chip. Feb. 7, 2016; 16(3):471-9. doi: 10.1039/c5lc01335f.

Collins et al., Highly Localized Acoustic Streaming and Size-Selective Submicrometer Particle Concentration Using High Frequency Microscale Focused Acoustic Fields. Anal Chem. May 17, 2016; 88(10):5513-22. doi: 10.1021/acs.analchem.6b01069. Epub May 2, 2016.

Collins et al., The particle valve: On-demand particle trapping, filtering, and release from a microfabricated polydimethylsiloxane membrane using surface acoustic waves. Applied Physics Letters. Jul. 24, 2014; 105:033509-1. doi: 10.1063/1.4891424.

Destgeer et al., Adjustable, rapidly switching microfluidic gradient generation using focused travelling surface acoustic waves. Applied Physics Letters. Jan. 15, 2014; 104: 023506-1. doi: 10.1063/1.4862322.

Destgeer et al., Continuous separation of particles in a PDMS microfluidic channel via travelling surface acoustic waves (TSAW). Lab Chip. Nov. 2013; 13(21):4210-6. doi: 10.1039/c3lc50451d.

Destgeer et al., Submicron separation of microspheres via travelling surface acoustic waves. Lab Chip. Dec. 21, 2014;14(24):4665-72. doi: 10.1039/c4lc00868e. Epub Oct. 14, 2014.

Ding et al., Surface acoustic wave microfluidics. Lab Chip. Sep. 21, 2013; 13(18):3626-49. doi: 10.1039/c3lc50361e. Review.

Shilton et al., Particle concentration and mixing in microdrops driven by focused surface acoutstic waves. Journal of Applied Physics. Jul. 9, 2008; 104:014910-1. doi: https://doi.org/10.1063/1.2951467.

* cited by examiner

MICROFLUIDIC PARTICLE MANIPULATION

CROSS REFERENCE TO RELATED APPLICATION(S)

This application is a national stage filing under 35 U.S.C. § 371 of International Application No. PCT/SG2016/050560, filed Nov. 11, 2016, which claims priority to Singapore Application No. 10201509280Y, filed Nov. 11, 2015, the entire contents of each of which are incorporated herein by reference.

The present invention relates to the manipulation and, more particularly, to the sorting of particles. Still more particularly, the present invention relates to the use of acoustic waves, including surface acoustic waves, for the manipulation and sorting of particles. In an example, the present invention may be used for the sorting of cells.

Rapid cell and particle sorting is an essential process in many research, industrial and clinical medicine applications, including cancer research,[1,2] reproductive technologies,[3] directed evolution,[4] high-throughput drug screening,[5] production of acoustic contrast agents,[6] water monitoring[7] and rare cell enrichment.[8,9] To discriminate between cell populations, these methods ideally make use of a physical parameter that differs between different populations, such as size,[10-12] magnetic susceptibility,[13-15] acoustic contrast,[6,7] electrical permittivity[18] or deformability,[19] so that sorting occurs passively in the presence of a continuously applied force field and/or flow. In the case of cells, this methodology can be readily used to sort between different types of cells, though is less adept at sorting within heterogeneous cell populations, where fluorescence detection[20] or impedance spectroscopy[21,22] can discriminate based on parameters such as cell function or morphology. Though more versatile, these methods require a separate and coordinated on-demand actuation system to physically translate the selected cells to a separate reservoir. Fluorescence activated cell sorting (FACS) in flow cytometry is the gold standard for cell sorting, where selected cells are electrically charged, aerosolized and subsequently deflected in an electric field.[23] Though FACS is used to sort at high rates, the aggregate systems are typically large, expensive, and not amenable to portable platforms.

There is increasing interest in equivalent on-chip sorting systems, many of which aim to replicate the sorting efficacy of that in conventional flow cytometry in an inexpensive integrated platform, though this has necessitated the development of microscale actuation systems that do not require the generation of a cell-containing aerosol as is the case in FACS. Most commonly, dielectrophoretic forces are applied locally to droplets containing cells due to large permittivity differences between oil and water phases,[24] where droplets are a useful tool for locally containing the volume surrounding cells,[25] though is throughput-limited in the case of sorting in a single phase. Alternatively, Chen et al. demonstrated a device utilizing pulsed-laser induced cavitation to translate individual cells to a separate outlet stream at kHz rates.[26] However, the biocompatibility of cavitation in this context is not well understood, considering that cavitation has been used elsewhere for cell lysis.[27] Acoustic fields present an attractive biocompatible alternative for sorting, where cells have been trapped while retaining their viability/morphology over periods of exposure from minutes to hours,[28-33] and where electrical driving circuits can be readily miniaturized for portable and cost-effective use.[34] Utilizing bulk acoustic waves (BAW) generated by a bulk wavemode transducer affixed to a resonant chamber, Jakobsson et al. demonstrated the active sorting of fluorescent beads in a continuous flow, where select particles were translated to the standing wave nodal position.[35] Surface acoustic wave (SAW) transducers, however, are generally easier to integrate with microfluidic systems, where the shape of the acoustic field can be easily defined by choosing an appropriate interdigital transducer (IDT) pattern and location, with IDTs defining the SAW path on a piezoelectric substrate. SAW has similarly been applied to high-throughput sorting; Nawaz et al. and Ren et al. used opposing IDT structures to generate sub-ms standing SAW pulses, where selected particles and cells are translated as they pass through the acoustic field,[36,37] conceptually similar to work by Ding et al., where frequency shifts in the standing wave field resulted in shifts in the nodal position.[38]

As applied, however, there is room to improve on the robustness and selectivity of standing SAW-based sorting, where finely tuned inlet and outlet flow rates are required because particles are translated small distances. This is an inherent feature of standing waves, where the maximum displacement is less than one quarter of the acoustic wavelength. Thus, the smallest wavelength that can be used is dictated by the translation distance required. However, as the maximum translation distance is proportional to the acoustic wavelength in the case of a standing SAW, and as the minimum beam width is on the order of the acoustic wavelength, there is a trade-off between the particle displacement and the width of the sorting region. The minimum translations required for the sorting of cells using standing SAW, on the order of 20 μm, thus generate sorting regions with a width of ~150-300 μm.[36,37]

Travelling waves have a distinct advantage for sorting applications in that there is no inherent limit in the distance by which a particle subject to the resulting force field can be displaced, though the field strength will decay exponentially in the propagation direction, where travelling SAW has been used extensively for size-based separation and fluid manipulation over distances greater than $\lambda$.[39-45] Franke et al. and Schmid et al. used travelling SAW to rapidly sort particles, droplets and cells, where the acoustic field is localized using a circular polydimethylsiloxane (PDMS) post connecting the SAW substrate to a flow channel and actuated with an IDT structure that permits beam location adjustment.[46,47] The displacement is also limited in this case, however, where the acoustic wave attenuates as it passes through the post coupling the substrate wave to the channel and will only occur above the post.[48] The minimum width permitted is also limited practically by non-trivial fabrication constraints and the need to use a post that is at least on the same scale as $\lambda$, where larger $\lambda$ are needed to minimize efficiency-reducing attenuation through the post structure. Phononic structures have the potential to direct acoustic energy to specified regions,[49-53] but typically require the use of a coupling material that reduces device efficiency,[54] and has not yet been applied to rapid sorting.

Additionally, while the direct utilization of traveling SAW can be advantageous for many applications, this methodology requires its use in situations where the translated objects have similar and suitable acoustic properties for robust and reliable sorting. Less utilized are the acoustic forces produced in the body of the fluid itself for particle manipulation. The result of this body force includes both bulk fluid motion and a hydrostatic pressure differential across the length of the acoustic beam[55]. The advantage of controlled, acoustic actuated fluid motion is that selective translation can occur irrespective of the particle properties, where particles are entrained by viscous drag in fluid streamlines[26]. Acoustic-actuated flow control has similarly not yet been applied to rapid sorting, though would be advantageous in a SAW implementation because of this method's simplicity and biocompatibility.

Avoiding the use of additional coupling structures to concentrate or localize acoustic energy, highly focused high-frequency SAW has substantial potential in microfluidic applications, where acoustic field gradients can be generated on the scale of 10's of μm. Previous work has demonstrated the potential for focused travelling SAW to concentrate energy at a location for efficient and targeted actuation, including for droplet translocation, droplet production and particle concentration.[56-59]

As such, typically, existing techniques all suffer from slow response times and consequently low sorting rates or low cell viability under high electric fields. Accordingly, improvements in cell sorting devices and methods are needed.

The listing or discussion of an apparently prior-published document in this specification should not necessarily be taken as an acknowledgement that the document is part of the state of the art or is common general knowledge.

Any document referred to herein is hereby incorporated by reference in its entirety.

The present invention relates to an improved method and device for particle sorting, manipulation, and characterization that would be useful for numerous applications. In an embodiment, the present invention includes the concentration, focusing, and/or characterisation of particles such as cells and/or microorganisms.

In a first aspect of the present invention, there is provided a microfluidic device for manipulating a particle in a fluid suspension, the device comprising: (a) a substrate; (b) a first channel defined in the substrate, the first channel having an inlet for receiving the fluid suspension and an outlet for discharging the fluid suspension; and (c) an acoustic source configured to generate and deliver a travelling surface acoustic wave transverse the flow of the fluid suspension in the channel, wherein the acoustic source is an interdigital transducer (IDT), the IDT comprises a plurality of concentric circular arcs having a tapered end directed at the channel, and the tapered end has an aperture of between 4 μm and 150 μm. In alternative embodiments, the aperture of the acoustic source may be greater than 150 μm when the device is scaled up.

Any suitable technique may be used to create the travelling surface acoustic wave. For example, the surface acoustic wave may be created by a generator attached to the surface of the microfluidic channel. In certain embodiments, the surface acoustic wave is created by using an interdigitated electrode or transducer able to convert electrical signals into acoustic wave able to travel along the surface of the substrate, and in some cases, the frequency of the surface acoustic wave may be controlled by controlling the spacing of the finger repeat distance of the interdigitated electrode or transducer.

By "interdigital transducer (IDT)", it is meant to refer to any one, two, or more electrodes containing a plurality of "fingers" extending away from the electrode, wherein at least some of the fingers are interdigitated. In an embodiment, particularly when the piezoelectric substrate is lithium niobate, there are about 20 to 100 finger pairs in the electrode. The fingers may be of any length, and may independently have the same or different lengths. The fingers may be spaced on the transducer regularly or irregularly. In some cases, the fingers may be substantially parallel, although in other embodiments they need not be substantially parallel. In an embodiment, the present IDT comprises a plurality of concentric circular arcs having a tapered end that is directed towards the microfluidic channel. The tapered end forms the beam aperture. The angle subtended at the center of the concentric circular arcs of the IDT may be about 5 to 90 degrees. Preferably, in an embodiment, the angle is about 26 degrees.

The IDT may be supplied with any suitable AC supply known to the skilled person. The acoustic energy is maximized at the resonance frequency that is determined by the dimensions of the electrode fingers, size and spacing.

In an embodiment, the aperture size of the tapered end of the IDT is 56 μm. Advantageously, the size of the aperture produces a focused beam that allows the present microfluidic device to implement single-cell sorting. By "aperture", it is meant to refer to the width of the inner arc of the IDT that is directed towards the microfluidic channel. The 56 μm wide aperture can produce a 25 μm wide travelling sound beam giving rise to a 25 μm wide sorting/manipulation region within the microfluidic channel. The aperture size can be one wavelength to 15× wavelength, more preferably, the aperture size is about from 4-150 μm. In this embodiment, 10 μm is the wavelength, and the 56 μm aperture is 5.6× wavelength.

Preferably, the device further comprises a second channel for delivering and containing a second fluid. The fluid may be any suitable carrier. The second channel may also be defined with the substrate or may be defined in a separate substrate. Importantly, the second channel has an inlet for receiving the second fluid and an outlet for discharging the second fluid. It is also disposed intermediate the first channel and the acoustic source, wherein the first and second channels are disposed alongside each other and the direction of flow of fluids in the first and second channels are in the same direction, the first and second channels are connected in fluid communication by a pumping channel disposed between the first and second channels, the pumping channel connecting the first and second channels is disposed intermediate the inlets and outlets of both the first and second channels, and the acoustic source is disposed adjacent the second channel to generate and deliver the travelling surface acoustic wave transverse the flow of the fluid from the second channel to the first channel through the pumping channel, the flow of the fluid from the pumping channel to the first channel manipulates the particle in the fluid suspension in the first channel.

Preferably, the first and second channels has a width of about 120 μm and a height of about 25 μm.

Preferably, the width of the second channel adjacent the acoustic source is narrower than the width of the second channel at the inlet and outlet. In an embodiment, the acoustic source is disposed adjacent the second channel at this narrowed constricted location of the second channel. Preferably, the width of the second channel adjacent the acoustic source is about 20 μm.

Preferably, the pumping channel has a width of about 20 μm and a length of about 170 μm. As such, the distance between the two first and second channels may not be greater than 20 μm.

Preferably, the inlet of each of the first and second channel is in fluid communication with a pump. Any suitable pump, for example any peristaltic or circulation pump, may be used to deliver and drive the fluids in the first and second channels. For example, in an embodiment, a syringe may be used.

Preferably, the substrate is a piezoelectric substrate. More preferably, the piezoelectric substrate is lithium niobate. Alternatively, any suitable piezoelectric material may be used for the substrate. For example, lithium tantalite, lanthanum gallium silicate or the like.

The surface acoustic waves can be formed on a piezoelectric substrate or other material that may be coupled to a microfluidic substrate at specific locations, e.g., at locations within the microfluidic substrate where sorting is to take place. Suitable voltages (e.g., sinusoidal or other periodically varying voltages) are applied to the piezoelectric substrate, which converts the electrical signals into mechanical vibrations, i.e., surface acoustic waves or sound. The sound is then coupled to the microfluidic substrate, e.g., from the surface of the material. In the microfluidic substrate, the vibrations pass into liquid within microfluidic channels in the microfluidic substrate, which give rise to internal streaming within the fluid and acoustic radiation that directly exterts a force on particles exposed to the acoustic field. Thus, by controlling the applied voltage, streaming within the microfluidic channel, as well as the acoustic radiation force on particles, may be controlled, which may be used to direct or sort particles within the microfluidic channel, e.g., to particular regions within the microfluidic substrate. The travelling surface acoustic wave may induce two acoustic effects—an acoustic streaming and an acoustic radiation. In addition to acoustic radiation, acoustic streaming may also be dominant if a suitable power is supplied to the IDT in the microfluidic device. Advantageously, acoustic streaming may also provide useful cell manipulation capability to the microfluidic device.

Advantageously, the present invention requires only one IDT to generate the travelling the surface acoustic wave placed adjacent the microfluidic channel to deliver the wave transverse the flow of the fluid suspension in the channel.

The piezoelectric substrate may be activated by any suitable electronic input signal or voltage to the piezoelectric substrate (or portion thereof). For example, the input signal may be one in which a periodically varying signal is used, e.g., to create corresponding acoustic waves. For instance, the signals may be sine waves, square waves, sawtooth waves, triangular waves, or the like. The frequency may be for example, between about 50 Hz and about 100 KHz, between about 100 Hz and about 2 kHz, between about 100 Hz and about 1,000 Hz, between about 1,000 Hz and about 10,000 Hz, between about 10,000 Hz and about 100,000 Hz, or the like, and/or combinations thereof. In some cases, the frequency may be at least about 50 Hz, at least about 100 Hz, at least about 300 Hz, at least about 1,000 Hz, at least about 3,000 Hz, at least about 10,000 Hz, at least about 30,000 Hz, at least about 100,000 Hz, at least about 300,000 Hz, at least about 1 MHz, at least about 3 MHz, at least about 10 MHz, at least about 30 MHz, at least about 100 MHz, at least about 300 MHz, or at least about 1 GHz or more in some embodiments. In certain instances, the frequency may be no more than about 1 GHz, no more than about 300 MHz, no more than about 100 MHz, no more than about 30 MHz, no more than about 10 MHz, no more than about 3 MHz, no more than about 1 MHz, no more than about 300,000 Hz, no more than about 100,000 Hz, no more than about 30,000 Hz, no more than about 10,000 Hz, no more than about 3,000 Hz, no more than about 1,000 Hz, no more than about 300 Hz, no more than about 100 Hz, or the like. In a preferred embodiment, the frequency of the travelling surface acoustic wave is greater than 50 MHz and, more preferably, about 386 MHz. It is discovered that, with the present invention, a higher frequency results in the generation of a highly focused and confined beam which, in turn, results in a force allowing the manipulation of the particles.

The IDT may be positioned on the piezoelectric substrate (or other suitable material) such that acoustic waves produced by the IDT are directed at a region of acoustic coupling between the piezoelectric substrate and the microfluidic channel. This region may also be referred to as the sorting/manipulation region.

In an embodiment, The IDT and the microfluidic channel shares the same substrate. The IDT is fabricated by depositing metallic electrodes on the piezoelectric substrate; the microfluidic channel may be an open layer with concave channel. By bonding this open layer onto the piezoelectric substrate, it can close the open channel and form a closed microfluidic channel. As the beam does not have uniform width along the wave propagation, the distance from the IDT to the channel is also important to ensure a highly confined sound beam in the channel region. The distance from the inner arc (tapered end) of the IDT to the microfluidic channel is about 0-1.5 mm. In the embodiment with an IDT aperture of 56 μm as described earlier, the minimum beam width of the wave is about 25 μm at the position that is 0.3 mm from the IDT.

Alternatively, the piezoelectric substrate and the microfluidic channel may be coupled or physically bonded to each other, for example, using ozone plasma treatment, or other suitable techniques. In some cases, the rest of the piezoelectric substrate and the microfluidic substrate are at least acoustically isolated from each other, and in certain embodiments, the piezoelectric substrate and the microfluidic substrate are physically isolated from each other. Without wishing to be bound by any theory, it is believed that due to the isolation, acoustic waves created by the interdigitated electrode and the piezoelectric substrate do not affect the microfluidic substrate except at regions where sorting is generally desired, e.g., at one or more coupling regions. Such acoustic coupling may be used, in certain embodiments, to increase sorting speed, e.g., due to better control of the passage of surface acoustic waves.

In one set of embodiments, the coupling region of the piezoelectric substrate and the microfluidic substrate is located within or proximate the location where the fluid suspension of particles are to be manipulated and/or sorted within the microfluidic substrate. Thus, for instance, the coupling region may be positioned within or at least near a junction between an inlet microfluidic channel, and two or more outlet microfluidic channels, such that acoustic waves transmitted into the microfluidic substrate through the coupling region are at least sufficient to affect liquid streaming within the microfluidic channels, and in some embodiments such that sorting of droplets or other species is able to occur. In one set of embodiments, there may be three, four, five, or more outlet microfluidic channels, and in some embodiments the sorting of droplets or other species into the two or more outlet microfluidic channels may be controlled by controlling the surface acoustic waves, e.g., by applying suitable voltages to the piezoelectric substrate.

Preferably, the surface acoustic wave has an average frequency of between 100 MHz and 1000 MHz. More preferably, the frequency is 386 MHz. The frequency may vary during use of the microfluidic device. In particular, the spacing between adjacent electrode fingers can gradually change to have a wider working frequency range.

Preferably, the substrate comprises a plurality of outlet channels.

By "channel", it is meant to refer to any feature on or in (or defined) in the substrate that at least partially directs flow of the fluid. The channel can have any cross-sectional shape (circular, oval, triangular, irregular, square or rectangular, or the like) and can be covered or uncovered. In embodiments where it is completely covered, at least one portion of the channel can have a cross-section that is completely enclosed, or the entire channel may be completely enclosed along its entire length with the exception of its inlet(s) and/or outlet(s). A channel may also have an aspect ratio (length to average cross sectional dimension) of at least 1:1, more typically at least 2:1, 3:1, 5:1, 10:1, 15:1, 20:1, or more. An open channel generally will include characteristics that facilitate control over fluid transport, e.g., structural characteristics (an elongated indentation) and/or physical or chemical characteristics (hydrophobicity vs. hydrophilicity) or other characteristics that can exert a force (e.g., a containing force) on a fluid. The fluid within the channel may partially or completely fill the channel. In some cases where an open channel is used, the fluid may be held within the channel, for example, using surface tension (i.e., a concave or convex meniscus). It is understood that there may be any number of channels that may be formed in the substrate. In addition, these channels may include any number of branching or forking into a series of a plurality of further channels that are useful to facilitate the sorting of particles in a fluid suspension.

The channel may be of any size, for example, having a largest dimension perpendicular to fluid flow of less than about 5 mm or 2 mm, or less than about 1 mm, or less than about 500 microns, less than about 200 microns, less than about 100 microns, less than about 60 microns, less than about 50 microns, less than about 40 microns, less than about 30 microns, less than about 25 microns, less than about 10 microns, less than about 3 microns, less than about 1 micron, less than about 300 nm, less than about 100 nm, less than about 30 nm, or less than about 10 nm. In a preferred embodiment, the width of the microfluidic channel is about between 10 μm and 1000 μm, and the height of the channel is about 1 μm to 100 μm. In some cases the dimensions of the channel may be chosen such that fluid is able to freely flow through the article or substrate. The dimensions of the channel may also be chosen, for example, to allow a certain volumetric or linear flowrate of fluid in the channel. Of course, the number of channels and the shape of the channels can be varied by any method known to those of ordinary skill in the art. In some cases, more than one channel or capillary may be used. For example, two or more channels may be used, where they are positioned inside each other, positioned adjacent to each other, positioned to intersect with each other, etc.

The wall of the microfluidic channel wall may be of any thickness. In order to minimize the sound attenuation in the path of the acoustic wave, the wall should be as thin as possible. The wall may be as thin as 5 μm to 100 μm. This wall thickness refers to the thickness of the material that separates the fluid confined in the channel from the air. Ideally, this wall should be as thin as possible to minimize the wave attenuation. In reality, this wall thickness is from 5-100 um, considering the wave attenuation, fabrication feasibility, and sealability of the channel.

Preferably, the particle is any particle selected from the group: organic particles, inorganic particles, biological cells, and microorganisms. The cells may either be labelled or not prior to sorting/manipulation.

By "cell", it is meant to refer to its ordinary meaning as used in biology. The cell may be any cell or cell type. For example, the cell may be a bacterium or other single-cell organism, a plant cell, or an animal cell. If the cell is a single-cell organism, then the cell may be, for example, a protozoan, a trypanosome, an amoeba, a yeast cell, algae, etc. If the cell is an animal cell, the cell may be, for example, an invertebrate cell (e.g., a cell from a fruit fly), a fish cell (e.g., a zebrafish cell), an amphibian cell (e.g., a frog cell), a reptile cell, a bird cell, or a mammalian cell such as a primate cell, a bovine cell, a horse cell, a porcine cell, a goat cell, a dog cell, a cat cell, or a cell from a rodent such as a rat or a mouse. If the cell is from a multicellular organism, the cell may be from any part of the organism. For instance, if the cell is from an animal, the cell may be a cardiac cell, a fibroblast, a keratinocyte, a heptaocyte, a chondracyte, a neural cell, a osteocyte, a muscle cell, a blood cell, an endothelial cell, an immune cell (e.g., a T-cell, a B-cell, a macrophage, a neutrophil, a basophil, a mast cell, an eosinophil), a stem cell, etc. In some cases, the cell may be a genetically engineered cell. In certain embodiments, the cell may be a Chinese hamster ovarian ("CHO") cell or a 3T3 cell.

In a second aspect of the present invention, there is provided a method for manipulating a particle in a fluid suspension, the method comprising: (a) introducing the fluid suspension along a first channel; and (b) using an acoustic source to generate a travelling surface acoustic wave transverse the flow of the fluid suspension in the first channel to manipulate the particle travelling in the first channel, wherein the acoustic source is an interdigital transducer (IDT), the IDT comprises a plurality of concentric circular arcs having a tapered end directed at the channel, and the tapered end has an aperture of between 4 μm and 150 μm.

In an embodiment, the aperture is 56 μm.

Preferably, the method further comprising: (a) introducing a fluid along a second channel, the second channel disposed alongside the first channel, the fluids in both channel travelling in the same direction, the second channel intermediate the first channel and the acoustic source; (b) connecting in fluid communication the second channel to the first channel with a pumping channel, the pumping channel disposed between the first and second channels, and intermediate the inlets and outlets of both the first and second channels, wherein the acoustic source is disposed adjacent the second channel on the opposing side of the first channel to generate and deliver the travelling surface acoustic wave transverse the flow of the fluid in the second channel and to pump the fluid from the second channel to the first channel through a pumping channel, and manipulating the particle in the fluid suspension in the first channel with the flow of the fluid from the pumping channel.

Particle manipulation occurs because (a) the translation of the particle with respect to the fluid within which it is suspended due to acoustic forces acting on the particle or particle surfaces; and/or (b) the translation of the fluid in which the particle is suspended due to acoustic-induced fluid motion. This fluid motion can also be induced by any IDT design known to those of ordinary skill in the art.

Preferably, each of the first and second channels has a width of about 120 μm and a height of about 25 μm.

Preferably, the width of the second channel adjacent the acoustic source is narrower than the width of the second channel at the inlet and outlet, thereby constricting the flow of the fluid in the second channel adjacent the acoustic source. Preferably, the width of the second channel adjacent the acoustic source is about 20 μm.

Preferably, the pumping channel has a width of about 20 μm and a length of about 170 μm.

Preferably, the inlet of each of the first and second channel is in fluid communication with a pump for pumping fluid through the channels.

Preferably, the microfluidic channel is defined in a substrate. The substrate may be a piezoelectric substrate, and the piezoelectric substrate may be lithium niobate.

Preferably, the surface acoustic wave has an average frequency of between 100 MHz to 1000 MHz.

Preferably, the particles comprises any particles selected from the group: organic particles, inorganic particles, biological cells, and microorganisms.

In a third aspect of the present invention, there is provided an interdigital transducer comprising a plurality of concentric circular arcs having a tapered end, wherein the tapered end has an aperture of between 4 μm and 150 μm.

In order that the present invention may be fully understood and readily put into practical effect, there shall now be described by way of non-limitative examples only preferred embodiments of the present invention, the description being with reference to the accompanying illustrative figures.

In the Figures:

FIG. 1: Schematic illustration of the device design. (a) Sheath flow is used to hydrodynamically focus the sample prior to the focused interdigital transducers (FIDTs), which generate the focused surface acoustic wave (SAW) that translates selected particles. (b) Highly focused SAW is used to sort at the single-particle level, where the width of the focused SAW is on the order of 10's of μm.

Figure 2:
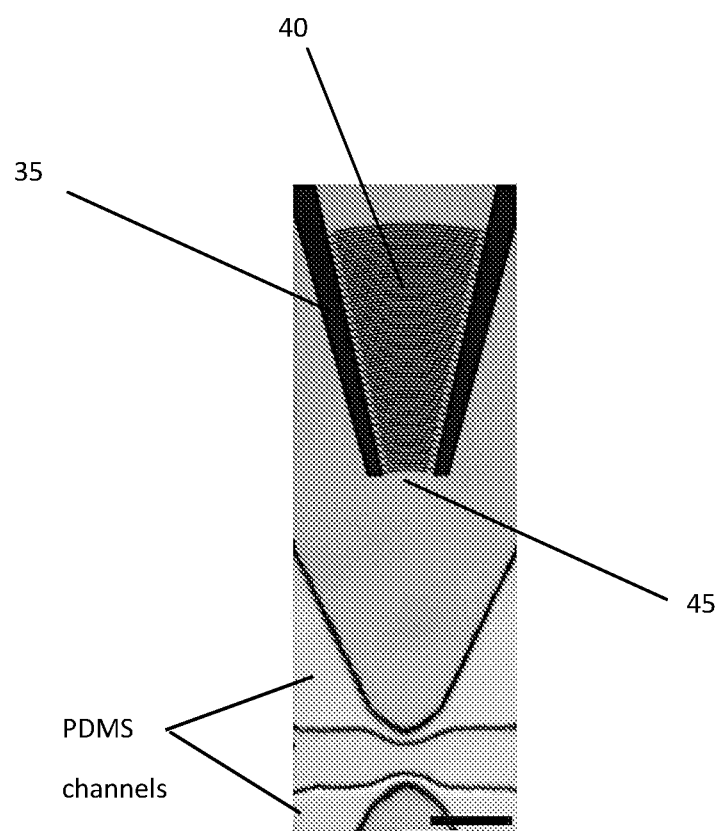

FIG. 2: Focused SAW and device design. The SAW beam is concentrated using a FIDT structure that results in maximum surface displacements in a defined region ~300 μm from the patterned FIDT features. The fluid channel is bonded directly to the FIDT structure, where the maximum-displacement region is centred on the channel location. The highly focused nature of the SAW results in large and localized substrate velocities for a given applied power. Scale bar represents 100 μm.

Figure 3:
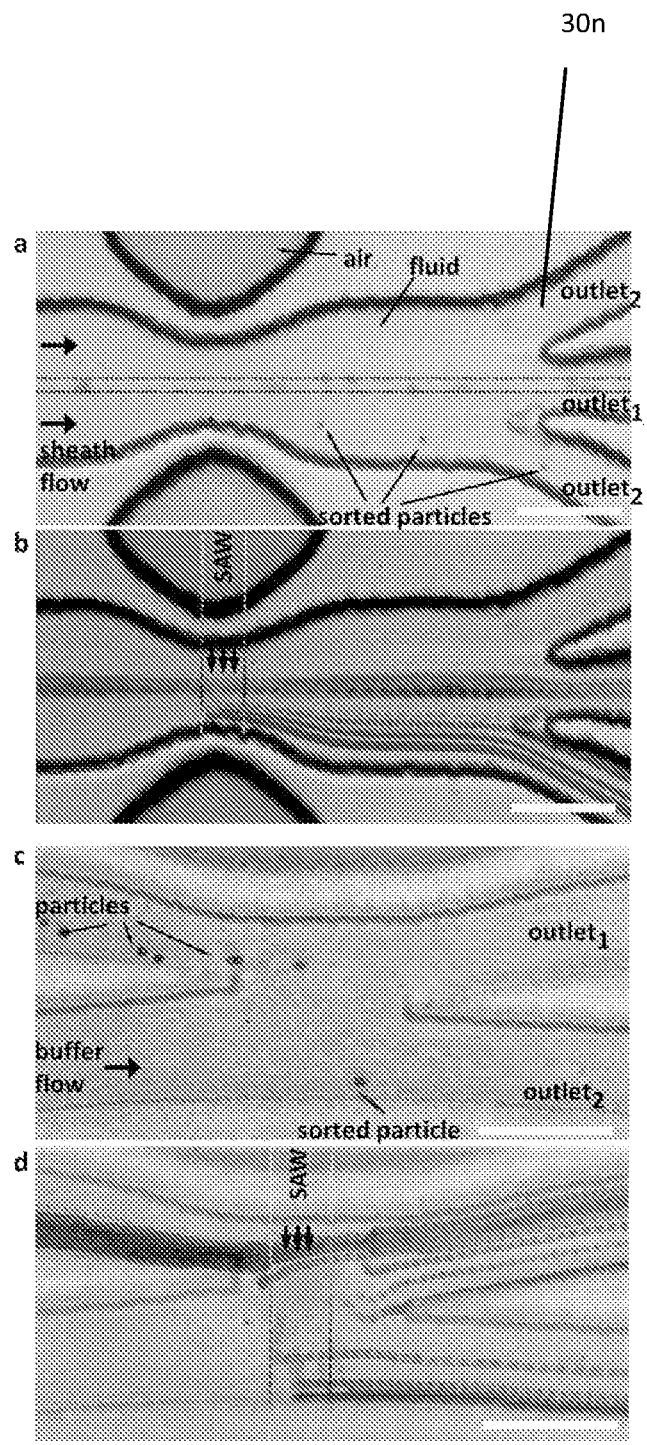

FIG. 3: Demonstration of particle sorting using pulsed SAW. (a,b) Individual 3 μm particles in a 1 μl/min flow, bounded by a focusing 8 μl/min sheath flow, are displaced using a 300 μs, 30 mW pulsed focused SAW at 5 ms intervals, which couples into the fluid within an ~25 μm wide beam. (c,d) While the geometry in (a,b) is optimized for sorting using minimal powers and displacements, particles can be translated substantial distances over several wavelengths using travelling SAW. Flow rates of 0.5 and 3 μl/min are used for the particle, buffer flow inlets with SAW pulsed at 100 mW for 1 ms at 10 ms intervals. (a,c) show individual images captured at 10,000 and 5,000 frames per second, respectively, whereas (b,d) show the overlay of 200 frames to demonstrate overall particle trajectories. Images taken from videos. All scale bars represent 50 μm.

Figure 4:
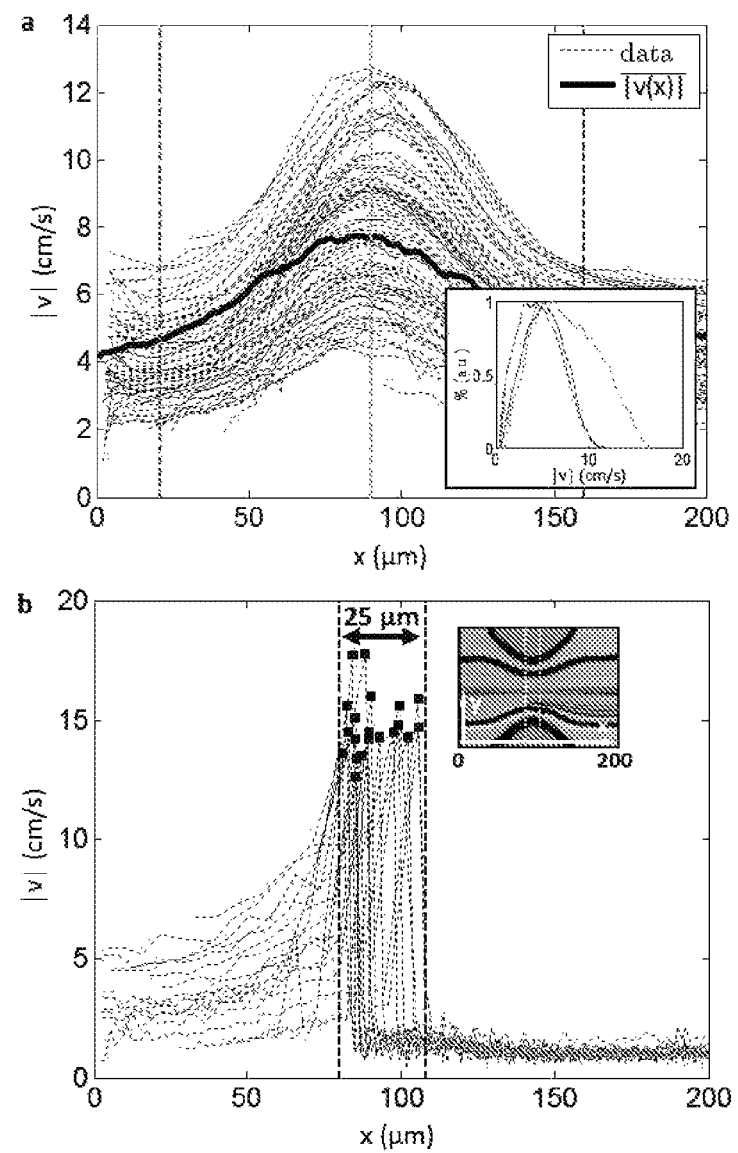

FIG. 4: Particle velocities in the sorting region. (a) The measured velocity magnitudes of tracked particles not subject to SAW roughly double in the flow constriction region, where the channel width is halved from 80 μm. Inset shows the velocity distributions just prior to (red), in the middle of (green) and after (blue) the flow constriction region, where the variation in velocity magnitudes is a result of the non-uniform (parabolic) flow velocity profile in the z-direction. (b) Velocity magnitudes of tracked particles sorted by the focused SAW. Particles are translated laterally within the beam of the tightly focused SAW, approximately 25 μm wide, where particles are translated at approximately 0.15 m/s using 300 μs, 30 mW pulses.

Figure 5:
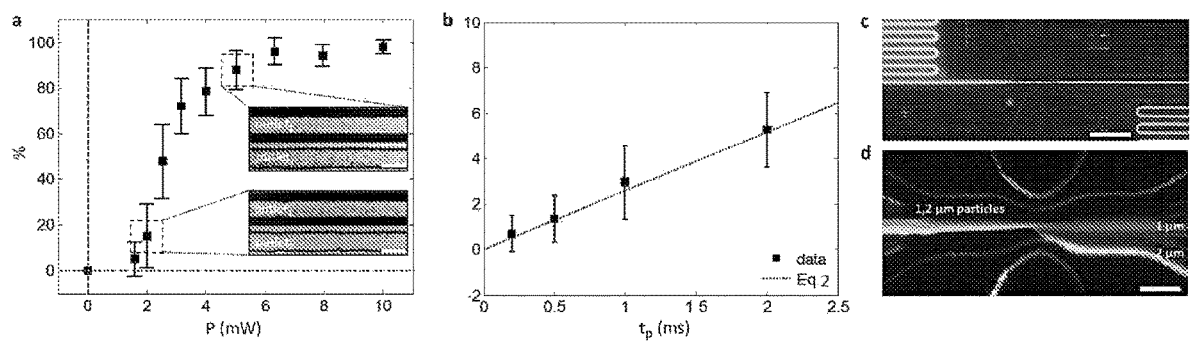

FIG. 5: Particle translation behaviour. (a) The percentage of particles translated using a continuously applied SAW is a function of the applied power, here with a total combined flow rate of 6 μl/min. Error bars represent one S.D. from 5 measurements of equal numbers of randomly selected particles (min. 20 selected). Scale bars are 20 μm. (b) The number of particles ejected per pulse is a function of the pulse length for a given particle concentration, here 0.7% v/v, with the average number per pulse defined by Eq. 2. (c) The 1 μm particles are shown travelling through the unsorted outlet meander. Scale bar 400 μm. (d) High frequency affords the sorting of particle sizes not otherwise accessible using travelling waves as per Eq. 1, here demonstrating the selective translation and sorting of 2 μm particles (blue) from 1 μm (green) particles at 4 μl/min with continuously applied 26 mW SAW. Scale bar is 50 μm.

Figure 6:
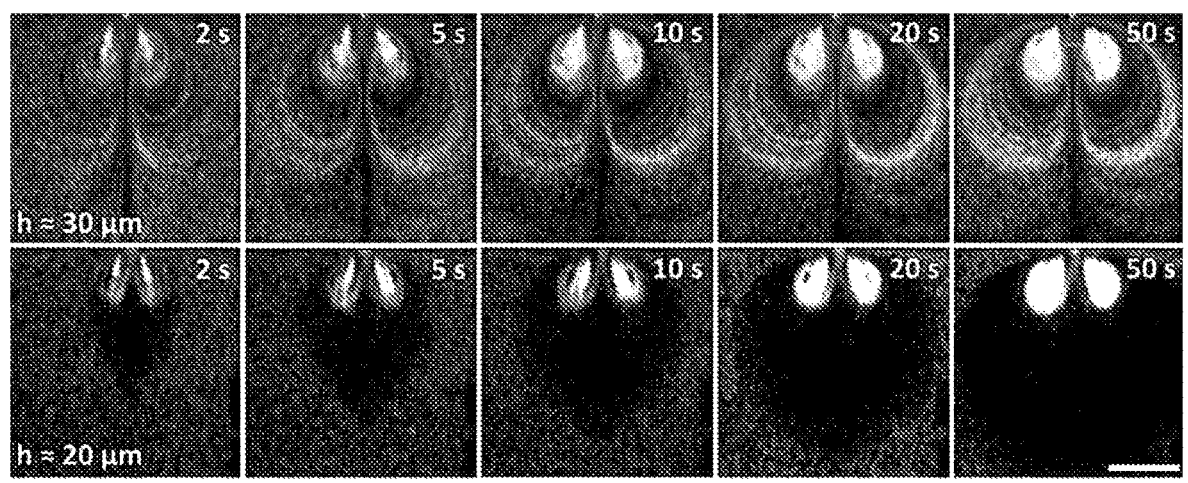

FIG. 6: Acoustic streaming in a confined chamber. In these images, 1 μm particles in a static flow condition are subject to a time-averaged flow induced by a body force in the direction of acoustic propagation in two different channel heights (30 μm and 20 μm). Increased acoustic forcing relative to acoustic-induced flow results in greater particle capture in trapping locations on either side of the acoustic beam, where particles are subject to the acoustic gradient force for longer periods in the channel with the smaller height. Scale bar is 100 μm.

Figure 7:
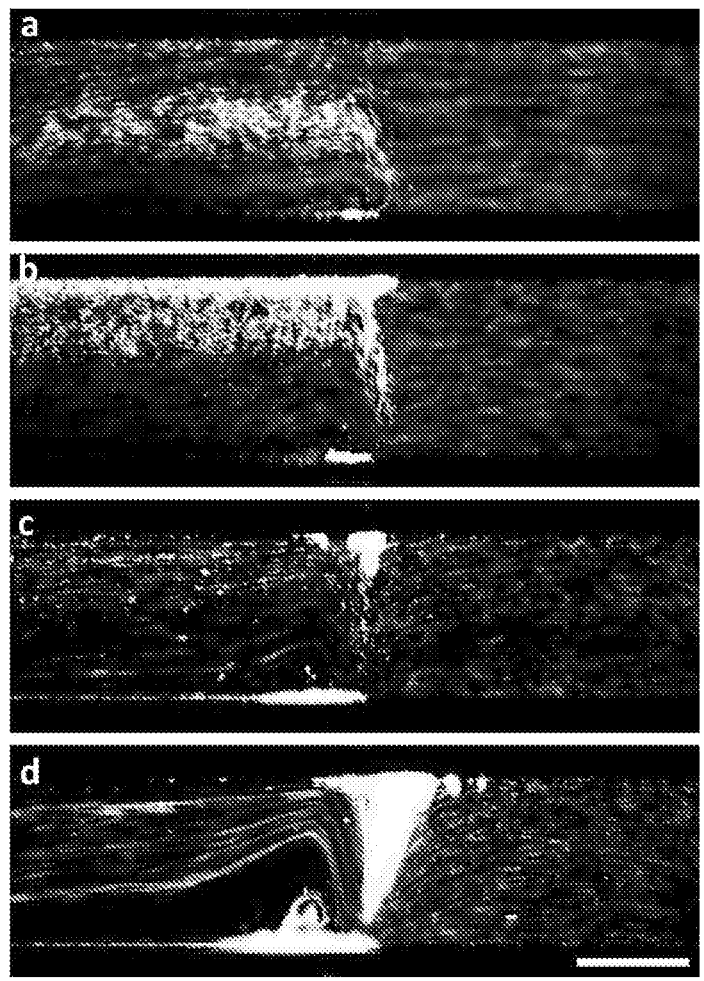

FIG. 7: Acoustic streaming in flow conditions. As the acoustic intensity is increased in a continuous flow (0.5 μl/min in a 160 μm channel) at (a) 10 mW, (b) 15 mW, (c) 25 mW, (d) 40 mW, in a solution containing 1 μm (green) and 2 μm (orange) particles, the influence of acoustic streaming induced flow relative to particle forces becoming apparent. Here the dominant particle force changes from direct acoustic radiation force (seen shifting the 2 μm particles in (a)) to fluid drag (in (d)), where particles are bound in streamlines according to the superposition of the incident and acoustic streaming flow fields. Scale bar is 100 μm.

Figure 8:
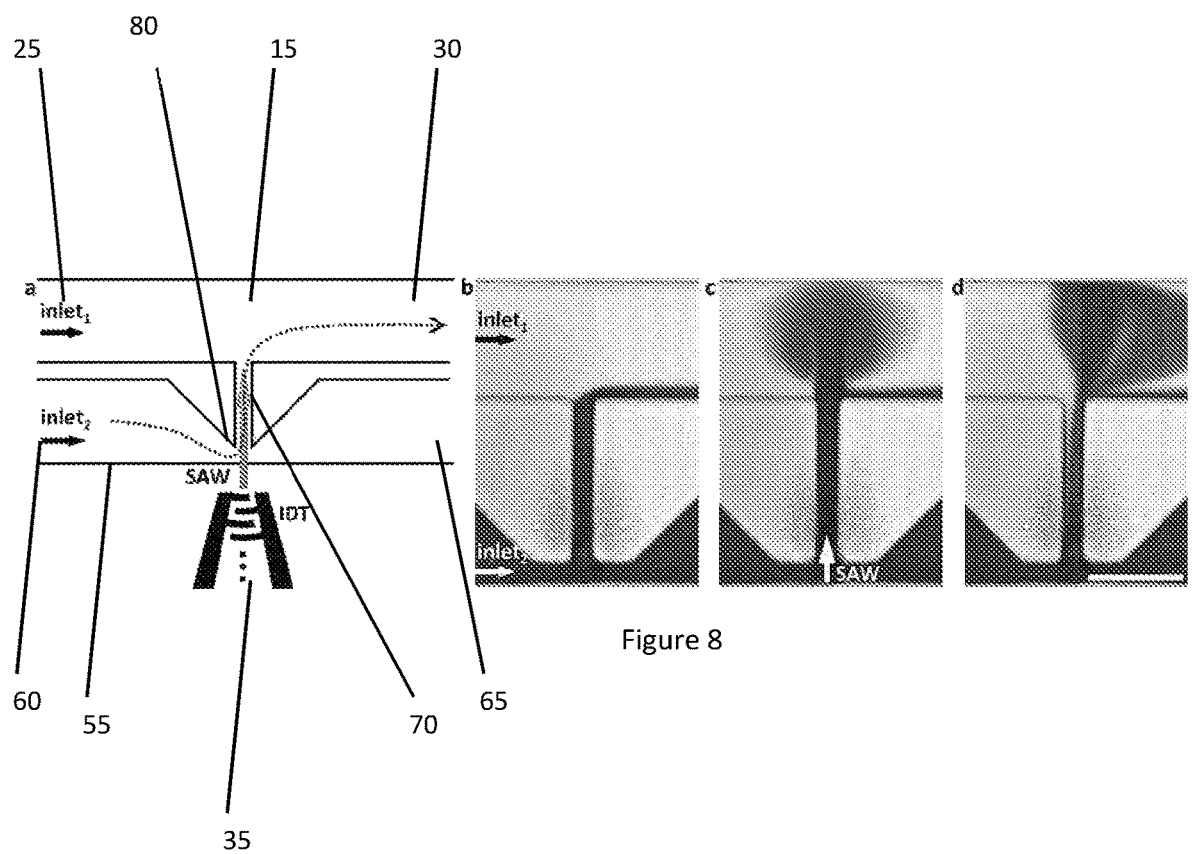

FIG. 8: Micropumping generated by acoustic streaming. In addition to the force exerted on suspended objects, the acoustic field can result in bulk fluid motion due to the force imparted within the fluid itself in the propagation direction, as well as due to acoustic cavitation. (a) In the steady-state, fluid flows through two microchannels with a pumping channel in-between, with a SAW used to pump fluid through this channel. (b) Blue dye is used here in the lower channel fluid to visualize the fluids originating from different channels. (c) With the application of a 10 μm wavelength (same design as in FIG. 2) 0.5 ms pulse SAW at 100 mW, fluid from the lower (dye-filled) channel is rapidly pumped into the upper one. (d) The pumped fluid remains in the upper channel and co-flows with the fluid there. Note the visualization of the parabolic flow profile with the rapidly translated dyed fluid body. Both top and bottom flows are 2 μl/min. Scale bar is 100 μm.

Figure 9:
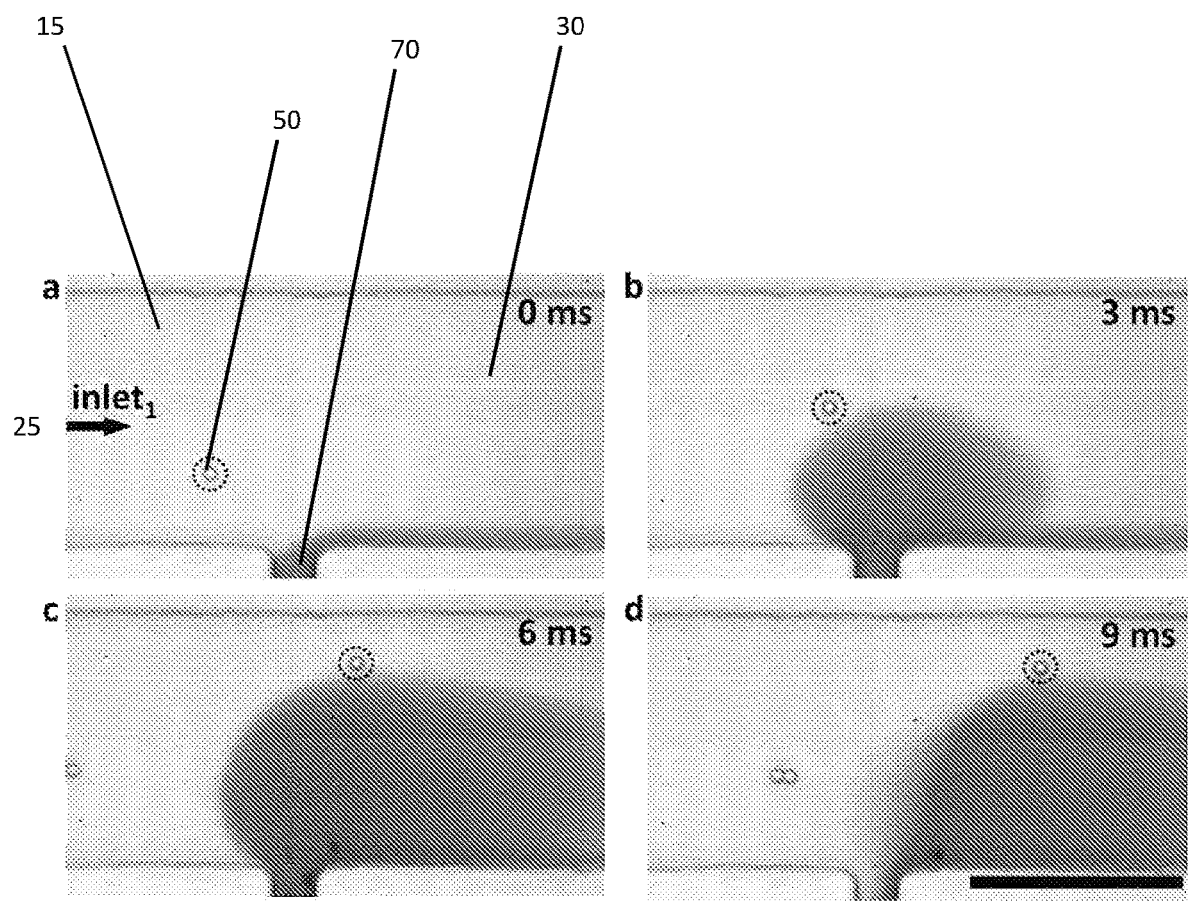

FIG. 9: Acoustic micropumping for particle translation. Only the upper channel from FIG. 8 is shown here. (a) A suspended 7 μm diameter polystyrene microparticle (circled, dotted line) continues with the lateral flow in the upper channel (same design as in FIG. 8). (b,c,d) With the application of a 5 ms SAW pulse at 50 mW (longer here than in FIG. 8 to better visualize particle motion), the particle is translated in the pumping direction within the fluid volume in which it is suspended. Subsequent particles that are not translated in this manner (dual particles in (d)) continue unperturbed in the direction of fluid flow. Both top and bottom flows are 2 μl/min. Scale bar is 100 μm.

In this work we use highly focused travelling SAW to obviate sorting region width limitations in order to generate large and rapid displacements for robust sorting. This localized SAW is produced using a 10 µm wavelength focused IDT (FIDT) structure that generates a beam ~25 µm wide at the narrowest point, sufficient to sort discrete particles using sub-ms SAW pulses without pre-ordering. The device concept is demonstrated in FIG. 1, where FIG. 1b demonstrates the single-particle level sorting that is achievable with a tightly focused translating force field. Furthermore, because of the high-frequency nature of the device generating these highly focused fields, particles as small as 2 µm can be translated and separated.

We also demonstrate the utility of this focused SAW device for streaming-based fluidic micropumping and the use of this pumping effect for particle translation. These effects are seen in FIGS. 8 and 9, where the application of short duration SAW (millisecond order) results in fluid pumping between co-flowing channels, and where suspended microparticle trajectories can be individually altered within a few milliseconds in fluid streamlines. This will be described in detail below. Both methodologies have potential use in a wide variety of applications, including the on-demand dilution of particle/cell mixtures and selective cell sorting, as an alternative to the deflection of airborne droplets in FACS.

1. SYSTEM PRINCIPLES AND DESIGN

With reference to FIG. 1, the device 10 has at least one channel 15 defined in a substrate 20. The channel has an inlet 25 for receiving a fluid suspension, where the fluid suspension contains the particles to be manipulated or sorted, and an outlet 30 for discharging the fluid suspension. In various embodiments, there may be a plurality of outlets 30n for providing channels for directing the sorted particles 50 to its respective or corresponding channels/receptacles.

The device 10 further comprises an acoustic source 35 for generating and delivering a travelling surface acoustic wave transverse the flow of the fluid suspension in the channel (see direction of arrow A). The acoustic source 35 is disposed near, at or adjacent the exterior wall of the channel. The wave generated by the acoustic source 35 manipulates the particles present in the channel when it travels along the channel from the inlet to the outlet. In particular, the particles 50 get manipulated when they travel past the acoustic source 35.

In an embodiment, the acoustic source 35 is an interdigital transducer (IDT) which comprises a plurality of concentric arcs 40 having a tapered end. The tapered end 45 is directed toward or at the channel. The tapered end 45 has an aperture of between 4 µm and 150 µm. In an embodiment, that aperture (or opening) has a width of about 56 µm.

The mechanisms underlying the translation of particles subject to a travelling acoustic wave force have been the subject of substantial theoretical work, where several expressions have been analytically been derived to estimate the directional force they experience.[60-62] In the limiting case where a particle is significantly smaller than the wavelength in the fluid, but not so small that viscous interfacial effects become important, such that the particle radius $R \gg \delta$, where $\delta$ is the viscous penetration depth given by $\delta = (2\rho\mu/\omega)^{1/2}$ and $\rho$, $\mu$ are the fluid density and viscosity and $\omega = 2\pi f$, the formulation from King is sufficient to describe particle motion. The travelling wave force is given by[61,63]

$$F = 64\rho\left(\frac{\omega}{c}\right)^4 R^6 v_0^2 \frac{1 + \frac{2}{9}(1 - (\rho/\rho_p)^2)}{(2 + \rho/\rho_p)^2} \quad (1)$$

where c is the speed of sound in the fluid, $\rho_p$ is the particle density and $v_0$ is the displacement velocity in the fluid, with $v_0 \sim v_{SAW}$. Principally, larger frequencies result in substantially larger forces due to the $F \sim \omega^4$ scaling. For objects approaching or exceeding the acoustic wavelength ($R \gtrsim \lambda$), however, the imparted force scales in a highly nonlinear way, albeit at a substantially larger magnitude than in the $R \gg \lambda$ regime[39,64]. The 386 MHz frequency employed here, where the resonant SAW frequency is given by $f = c\lambda$, corresponding to substrate wavelengths around 10 µm (with $c \approx 4000$ m/s) and fluid ones around 3 µm (with $c \approx 1500$ m/s), is thus capable of generating large forces efficiently on particles on the scale of the fluid wavelength to counteract the fact that standing waves typically generate larger force magnitudes for a given fluid displacement velocity.[60,63] For polystyrene particles in water, the particle radius should exceed approx. $1.4\lambda_f/2\pi$, where $\lambda_f$ is the fluid wavelength[64,65], corresponding to a minimum diameter of ~1.6 µm for $\lambda_{SAW} = 10$ µm above which the acoustic radiation force magnitudes are substantially larger, and thus much more effectively applied, than for particle diameters below this critical value (in which Equation 1 could reasonably be applied).

The direction of this force has a vertical as well as horizontal component, with the acoustic wave propagating at the Rayleigh angle, where $\theta_R = \sin^{-1}(c_f/c_s)$ is this quantity with respect to the orthogonal. In the system described here, with $c_s = 3964$ m/s and $c_f = 1484$ m/s, $\theta_R \approx 22°$. While the majority of the energy is thus directed vertically[57], rather than in the horizontal direction, in practice this vertical displacement also serves to aid the horizontal displacement when the force is applied laterally to a continuous flow, whereby the vertical component of the force pushes particles into the slower moving flow near the channel boundaries and thus allowing them to be exposed to the field and thus translated horizontally over a longer period of time.

The propagation of an acoustic field through a fluid medium will also result in a body force within the fluid that is imparted due to a momentum flux gradient, ultimately arising from the attenuation of the acoustic displacement along the propagation direction[66]. The outcome of this force is termed acoustic streaming, where bulk fluid motion occurs along the axis of maximum acoustic amplitude, and can result in recirculatory motion elsewhere. The magnitude of the acoustic body force is related by the attenuation coefficient of the fluid, where the body force can be expressed as[67]

$$F_B = \rho\beta v_0^2 e^{-2\beta x_i}$$

where $\beta$ is the attenuation coefficient of the fluid media, $\rho$ is the fluid density, $v_0$ is the initial (unperturbed) acoustic velocity magnitude, and $x_i$ is the direction along which the wave propagates. The attenuation coefficient scales with $\beta \sim \omega^2$, where higher frequencies (with $\omega = 2\pi f$) result in larger body forces that occur closer to the acoustic source. Also important for acoustic systems utilizing a SAW wavemode is the characteristic attenuation length along the substrate, approximately $\alpha^{-1} = 12\lambda_{SAW}$ in the case of the common water/lithium niobate fluid/substrate combination[68]. In microfluidic systems the frequency and channel dimensions can be chosen such that the attenuation length scale is on the order of that of the channel lengths or less to optimize the transfer of energy from the substrate to fluid motion. The time-averaged effect of this acoustic body force can result in hydrostatic pressure differentials for microfluidic pumping[55] We utilize these two effects, direct acoustic force on suspended microparticles with a focused travelling wave and acoustic micropumping, to selectively translate individual particles in a continuous flow. While the travelling wave force has been used to perform continuous size-based separation[69], here we demonstrate a highly focused system that is amenable to highly selective translation using an acoustic beam with a width on the order of individual cells. Additionally, while the physics of the acoustic streaming phenomena is well understood, we use it for the first time to demonstrate particle translation, where rapid micropumping of minute fluid volumes between co-flowing channels can selectively translate individual suspended objects in a continuous flow. At higher power levels, a focused acoustic beam can also induce rapid cavitation, further enhancing the micropumping effect.

In FIG. 2 we show the most highly focused SAW transducer yet demonstrated for microfluidic applications, resulting in efficiently generated substrate displacements concentrated in a target area. FIG. 2 shows the device that is bonded to a series of PDMS channels for selective continuous particle sorting due to acoustic forces acting on individual particles.

In FIGS. 8 and 9, we also show an alternative embodiment of the present invention, i.e. using this device 10 to rapidly pump fluid from one channel into another.

The embodiment presented in FIGS. 8 and 9 is similar to the embodiment presented in FIG. 1, i.e. the device 10 has a channel 15 and an acoustic source 35 for manipulating particles 50 travelling in the channel 15.

In this alternatively embodiment, there is a second channel 55 disposed alongside the first channel 15. Similarly, the second channel 55 has an inlet 60 for receiving a fluid and an outlet 65 for discharging the fluid. The direction of the fluid travelling in both the first 15 and second 55 channels are in the same direction. As seen in FIG. 8, the second channel 55 is disposed between the first channel 15 and the acoustic source 35. The two channels 15 and 55 are in fluid communication with each other via a pump channel 70 disposed between them. The pump channel 70 is disposed intermediate the inlets and outlets of the two channels 15 and 55. The pump channel 70 connects both first 15 and second 55 channels. At this location of the pump channel 70, the acoustic source 35 is disposed adjacent the second channel 55 to generate and deliver the travelling surface acoustic wave transverse the flow of the fluid from the second channel 55 to the first channel 15 through the pumping channel 70. This flow of fluid from the pumping channel 70 to the first channel 15 causes the manipulation of the particles in the first channel 15. In an embodiment, the portion of the second channel 55, where the pumping channel 70 branches out into the first channel 15, adjacent the acoustic source 35 is constricted 80. In other words, the width of the second channel 55 adjacent the acoustic source 55 is narrower than the width of the second channel 55 at the inlet 60 and outlet 65. In an embodiment, the width of the second channel 55 that is connected to the pumping channel 70 adjacent the acoustic source is about 20 μm.

In various embodiments, each of the first 15 and second 55 channels has a width of about 120 μm and a height of about 25 μm. The pumping channel 70 may have a width of about 20 μm and a length of about 170 μm.

In various embodiments, the inlets of the first 15 and second 55 channels may be connected in fluid communication to reservoirs or containers for containing and storing the respective fluids. In addition, the inlets 25 and 60 of each of the first 15 and second 55 channel is in fluid communication with a pump for pumping the fluids through the channels.

When a short (millisecond-order) SAW pulse is triggered a burst of fluid is pumped in the direction of SAW propagation from the channel closer to the SAW source to one more distal. The focused beam is advantageous as it allows the use of more confined, higher pressure drop pumping channels, which permit the more stable maintenance of continuous flow in a dual-flow configuration and the minimization of recirculatory backflow that can occur in wider channels[70] (see FIG. 6).

2. METHODS

In operation, the method of carrying particle manipulation by the device 10 of the present invention follows this general concept:
(a) introducing the fluid suspension along the first channel 15; and
(b) using an acoustic source 35 to generate a highly focused travelling surface acoustic wave transverse the flow of the fluid suspension in the first channel 15 to manipulate the particle 50 travelling in the first channel 15.

The manipulated particles 50 are then sorted out in respective plurality of outlets 30n.

The microfluidic particle manipulation device, or sorting system, is comprised of a series of FIDTs patterned on a piezoelectric 128° Y-cut lithium niobate (LN, LiNbO$_3$) substrate. The FIDTs are comprised of a 200 nm thick conductive Al layer on top of 7 nm thick Cr layer, which serves as an adhesion layer between the LN and Al. IDTs are patterned in concentric circle segments with a geometric focal point 160 μm from the IDT finger-pair, comprising 36 finger-pairs in total with an aperture of 56 μm at the proximal end up to 210 μm at the distal end, subtending an angle of 26°. The physically realized focusing region does not occur at the geometric one, however, with the maximum displacement and highest degree of focusing occurring ~300 μm from the last finger-pair, as noted in FIG. 2a. Due to the nature of wave propagation in an anisotropic material such as LN, the focusing point is effectively stretched in the crystallographic x-direction, the orientation with a minimum power flow angle and maximum propagation velocity,[71] where this effective displacement of the focal point from the geometric one is consistent with previous observations.[72] The entire device is coated with 300 nm SiO$_2$ using plasma enhanced chemical vapour deposition to prevent corrosion and improve bonding. FIG. 2b shows the completed device, composed of a microfluidic channel bonded directly to the assembled SAW device using plasma activation (PDC 32G, Harrick Plasma, USA).

The device is actuated using A/C pulses generated by a signal generator (APSIN3000HC, Anapico, Switzerland) and amplified by a power amplifier (Model 1100, Empower, USA). Imaging is performed using a high-speed camera (Fastcam Mini UX100, Photron Limited, Japan) on an inverted microscope. Elimination of birefringence effect that would otherwise result in a double-image in an optically anisotropic material is performed by mounting the completed device on a separate piece of double-sided LN in the opposite crystallographic orientation to that of the device. Particle trajectories were recorded using DMV software, a MATLAB-based software package that offers a suite of detection algorithms and parameters to track droplets and particles.[73]

Though PDMS has minimal effect on the resonant frequency of the device,[56] it strongly attenuates SAW displacement at the substrate interface, where the attenuation length is inversely proportional to the wavelength,[74] and is thus an important consideration for the high frequencies used here. The PDMS-attenuating region is minimized by enclosing the SAW transducer in an air-filled chamber, with only a 20 µm wide PDMS wall separating this region from the liquid filled channel.

In the case of particle translation due to the acoustic force imparted on the particles directly (FIGS. 2-5), a flow constriction serves to further minimize the distance the SAW is subjected to any attenuating interface prior to particle interaction and also to reduce the chance that multiple particles will be translated simultaneously by stretching the flow locally. As noted in FIG. 1a, the device has only two independent inlets and outlets, where both sheath and outlet$_2$ channel flows are hydrostatically balanced though the use of equidistant channel lengths upstream and downstream. The channel, fabricated using PDMS (10:1 elastomer/curing agent ratio) soft lithography on an SU-8 mould, has a height of 20 µm. To perform sorting, particle-free buffer flow and a particle solution containing 3 µm particles are injected in the sheath and sample inlets, respectively, using separate syringe pumps (NE-1000, New Era Pump Systems, Inc., NY, USA and Legato 111, KD Scientific, MA, USA). The sorting designs used have two independent outlets, outlet$_1$ and outlet$_2$. When a particle is in the path of the focused SAW at sufficient amplitude, it is translated from the sample stream into fluid flow that exits via outlet$_2$, as opposed to unsorted particles that exit via outlet$_1$.

In the case of particle translation due to micropumping, FIGS. 8 and 9 show a further embodiment of the present invention, i.e. the channel configuration used for particle translation. The method involved introducing a fluid along a second channel 55, the second channel 55 disposed alongside the first channel 15, the fluids in both channel travelling in the same direction, the second channel 55 intermediate the first channel 15 and the acoustic source 35; (b) connecting in fluid communication the second channel 55 to the first channel 15 with a pumping channel 70, the pumping channel 70 disposed between the first 15 and second 55 channels, and intermediate the inlets and outlets of both the first 15 and second 55 channels, wherein the acoustic source 35 is disposed adjacent the second channel 55 on the opposing side of the first channel 15 to generate and deliver the travelling surface acoustic wave transverse the flow of the fluid in the second channel 55 and to pump the fluid from the second channel 55 to the first channel 15 through the pumping channel 70, and manipulating the particle in the fluid suspension in the first channel with the flow of the fluid from the pumping channel.

It can be seen that the upper first channel 15 contains a continuous fluid flow with suspended particles 50, where fluid from a co-flowing lower second channel 55 is injected with the application of a ms-order SAW to translate particles suspended within the upper first channel 15 by displacing the fluid in which the particles 50 are suspended in the fluid pumping/propagation direction. Both continuous flows are generated from separate syringe pumps (NE-1000, New Era Pump Systems, Inc., NY, USA and Legato 111, KD Scientific, MA, USA). Importantly, this pumping-based translation method is insensitive to the properties of the suspended object, as opposed to the case of a direct acoustic force on the particle which will be a function of its mechanical properties. This acoustic pumping effect is enhanced and isolated in a system where the pumping channel is on the order of the attenuation length in the substrate or larger. In the realization shown in FIGS. 8 and 9, the fluid flow first 15 and second 55 channels are 120 µm wide each and ~25 µm high. The lower flow second channel 55 contains a constriction 80 (to a 20 µm channel width) on either side of the focused SAW to prevent the formation of acoustic vortices, and where the 20 µm wide, 170 µm long pumping channel 70 has a width on the order of the focused SAW beam width to maximize the unidirectionality of pumping within this channel. The total propagation distance of the SAW at the substrate/water interface is thus the sum of the constricted 20 µm wide channel 80 through which the lower channel fluid continuously flows and the 170 µm pumping channel 70, yielding 190 µm in total, approx. 1.5 times the acoustic attenuation length for a 10 µm SAW. These channel dimensions can be scaled appropriately for a given acoustic wavelength and beam dimensions.

3. RESULTS AND DISCUSSION

Particle sorting can be accomplished over a minimal sorting width using focused SAW, where the beam width is minimized by using a small wavelength (10 µm), small aperture (56 µm at minimum) FIDT structure that results in a highly localized maximum displacement region. Further, displacements are maximized in utilizing travelling SAW, as opposed to standing SAW; at this wavelength a standing wave would yield a theoretical maximum displacement of 2.5 µm, as opposed to much larger translations possible with a travelling wave for a given wavelength, though the force magnitude is maximized in the near field due to the attenuation at the substrate/fluid interface with an attenuation length (at which the substrate velocity decays to 1/e) of approximately $12\lambda_{SAW}$.[55] We demonstrate both of these characteristics, where individual 3 µm particles are displaced with the application of a SAW. Pulses with periods $t_p \lesssim 1$ ms are utilized, similar to the pulse lengths in other work,[36,37,46,47] as minimizing the SAW exposure time in a continuous flow reduces the chance of unintended sorting events (false-positives). FIG. 3 shows that the highly focused beam, with an aperture of ~25 µm, is compatible with different device geometries, here using a flow focusing geometry (FIG. 3a,b) and a H-filter arrangement (FIG. 3c,d), where FIG. 3b,d show the trajectories of sorted and unsorted particles as a continuous particle stream passes through a pulsed SAW.

The fact that substantial displacements, ~50 µm in FIG. 3d, can be generated using short SAW pulses at low powers (≲100 mW) further reflects the advantages of a focusing aperture and a high-frequency (386 MHz) SAW that generates larger travelling wave forces as per Eq. 1, and 3 µm particles can be deterministically displaced more rapidly and at lower power levels than demonstrated elsewhere.[42] Partially displaced particles that do not exit via outlet2 are those subject to a sub-threshold acoustic force at the edge of the focused beam, outside the sorting region.

The power required is minimized by limiting the lateral displacement needed for sorting, hence the geometry in FIG. 3a requires lower powers for sorting at equivalent flow rates due to the 40 µm wide flow restriction region in the centre of the channel, half the 80 µm width immediately upstream and downstream. The effect of this flow restriction is reflected in the velocities of particles tracked through this region. FIG. 4a shows the velocity magnitudes of unsorted particles in the focused sorting region (those exiting through outlet1) where the average velocity magnitude doubles. Though flow focusing aligns the particles in the y-direction, a parabolic flow profile (resulting from the no-slip boundary condition at the fluid/channel interface) yields a range of particle velocities in the z-direction. The dotted lines in this figure show the particle velocity magnitudes of tracked particles, where the inset in FIG. 4a shows a histogram of these velocities. If the acoustic force acted solely in the direction of SAW propagation, this range of velocities would necessitate substantially higher powers to deterministically translate all particles, especially the fastest moving ones. As the $\theta_R$ that results from a LN/H$_2$O interface is directed principally in the direction normal to the surface, however, the velocity disparities are quickly eliminated, where particles are first pushed against the channel roof before being translated laterally. This is demonstrated in FIG. 4b, where despite a range of particle velocities prior to sorting, the maximum velocity magnitudes are equalized around approximately 15 cm/s with an applied power of 30 mW. Importantly, this feature of acoustic coupling also results in power-efficient translation, where the slower flow at the channel interface results in longer exposure times to the acoustic beam, resulting in equivalent lateral translation velocities for same-sized particles. The maximum translation velocities, effectively comprised of sole translation in the lateral direction, occurs within the ~25 μm wide sorting region. At the cessation of the SAW pulse, particles continue with the flow in the sorted outlet at a relatively uniform and low velocity, reflecting the low flow velocity at the fluid/channel interface.

The percentage of sorted particles can be directly attributed to both the power and length of the applied pulses; while characterizing the effects of these parameters is important for understanding the powers and pulse times required for sorting, modifying these parameters can also be used to perform selective fractionation. FIG. 5a shows the effect of increasing applied power on the percentage of particles sorted, as measured at the outlets (particle solution contains 1 μm tracer particles that are not sorted, whose path through the system is shown in FIG. 5c), where the quick transition from no sorting to near-complete sorting occurs due to the aforementioned velocity equalization with acoustic forcing at $\theta_R$. Sorting percentage is measured by the number of particles counted (min. 102 total) in outlet$_1$ and outlet$_2$ at different power levels (0-10 mW) from an input of 3 μm particles subject to a constantly applied SAW. The quantity of particles dispensed can be more deterministically defined, however, by changing the pulse length. FIG. 5b demonstrates that the number of particles sorted per SAW pulse is a linear function of the pulse length, where any number of particles in the sorting volume Vs when a SAW pulse is generated are translated; additional particles arriving in this region in the continuous flow while a SAW is generated will also be sorted. The slope of this line is a function of the particle concentration C, here 0.07% vol/vol, with the average number of dispensed particles given by $$N = CV_s\left(1 + \frac{t_p v_f}{w}\right) \quad (2)$$

where $t_p$ is the pulse time, w is the sorting region width and $v_f$ is the average flow velocity in the sorting region, provided the pulse lengths are at least as long as the time it takes for a particle to translate a sufficient distance to be sorted ($t_p \gtrsim O(100 \text{ μs})$).

An important consequence of using high frequencies is that substantially larger forces can be generated for equivalently sized particles subject to a travelling wave, as noted by the scaling in Eq. 1. This is demonstrated in FIG. 5d, where fluorescent 2 μm particles are separated from a solution with 1 μm particles in a continuous flow. This is the smallest size yet shown to be displaced using a travelling SAW, where recent work demonstrated the translation of particles as small as 3.2 μm using a 200 MHz field.[42] As SAW is readily capable of generating fields up to the GHz scale, this points the way to using travelling wave forces to potentially manipulate even smaller objects.

Not yet addressed is the potential for acoustic streaming to affect the flow profile in the vicinity of the focused acoustic beam. Acoustic streaming is a phenomena caused by the attenuation of the acoustic displacement amplitude as it passes through a dispersive media, including water, resulting in momentum transfer in the direction of acoustic propagation[55] This phenomenon can be used to drive fluid flow for pumping or mixing[72] or particle concentration, as demonstrated in FIG. 6. Here 1 μm particles are concentrated in the closed fluid streamlines in the vicinity (on either side) of the acoustic beam. This phenomenon can be understood in the context of the acoustic radiation force, where the acoustic force gradient prevents particles from passing through the region of maximum beam intensity[75], resulting in these particles being shifted into tighter streamlines with every pass through the focusing region. The magnitude of the acoustic force relative to the flow induced by acoustic streaming can also be altered, with viscous-shear induced drag (caused by the no-slip channel boundary conditions at the channel interfaces) resulting in an inverse relationship between flow velocity and channel height. This greater proportion of acoustic radiation force over fluid drag results in more complete particle capture in the case of smaller channel heights.

FIG. 7 shows the effect of increasing acoustic streaming on the trajectory of particles through an acoustic beam. FIG. 7a demonstrates the flow regime necessary for particle sorting, where the acoustic force results in particle displacement (here displacing 2 μm particles in combined 2+1 μm particle solution) without substantive disturbance to the flow profile. At higher applied powers in the same flow, acoustic streaming contributes more to the local velocity profile, leading to a transitional regime (FIG. 7d) where particles are displaced both according to the direct acoustic force, but also with the fluid streamlines in the vicinity of the acoustic beam. This opens the possibility for not only particle sorting, but also particle capture and concentration in a continuous flow—changing the ratio between the flow velocities induced by acoustic streaming and those from the continuous input flow shifts the regime from one where the acoustic particle force is dominant to one where fluid drag determines particle behaviour. Acoustic streaming, however, does not substantively affect the flow profile in high flow conditions, whose flow velocities exceed those induced by the travelling wave acoustic forces necessary to induce particle displacement (of >2 μm particles).

The body forces that give rise to acoustic streaming can also give rise to acoustic pumping effects, with a time-averaged hydrostatic pressure differential at either end of a channel in which a SAW is present resulting in fluid translation. Moreover, acoustic cavitation can occur at high displacement amplitudes, enhancing the fluid translation effect. In FIG. 8 we demonstrate the use of a focused pulsed SAW to perform micropumping between two co-flowing fluid bodies. FIG. 8a shows the pumping concept, where fluid pumped from the lower channel displaced fluid streamlines in the upper one. A body of fluid (on the order of nanolitres or less) which would usually continue through the flow constriction in the lower channel (FIG. 8b) is pumped in the direction of SAW propagation into the upper channel with the application of this SAW pulse (FIG. 8b,c). FIG. 9 shows the effect of this pumping on suspended microparticles, where (if appropriately located relative to the pumping outlet) they are translated with the fluid in which they are suspended (circled particle in FIG. 9), likewise in the direction of SAW propagation. Combined with an appropriate upstream particle/cell detection apparatus, this method points the way toward the selective and robust sorting of suspended micro and sub-micron objects regardless of their physical properties.

4. CONCLUSIONS

SAW has rightly been applied to a wide number of microfluidic applications, where their ability to generate substantial and biocompatible forces on particles, cells and droplets is an essential feature. Further, because these forces can be generated and applied locally, it is straightforward to integrate compartmentalized SAW systems with other microfluidic processes. Microfluidic high-speed sorting is one such application where SAW is ideally suited, where sufficient forces can be generated on cells using sub-ms pulses to translate them. Minimizing the width of the sorting region is essential to deterministic translation, where minimum-width standing wave transducers and limited PDMS posts have been previously demonstrated. For robust and reliable sorting in a variety of sample concentrations the sorting region should be comparable to the size of cells being processed.

In this work we have demonstrated the use of highly localized acoustic fields generated by focused SAW for single-particle level displacement, where deterministic sorting is made possible using a focused beam with a width of only 25 μm. As the minimum beam width is by necessity on the scale of the wavelength or larger, this is realized using a high-frequency, 386 MHz, 10 μm wavelength set of FIDTs. Using pulses on the scale of 100's of μs, sorting rates between 1-10 kHz can theoretically be achieved. Further, because objects with diameters down to 2 μm can be translated on-demand using this frequency, varying pulse lengths can also be used to create time-varying particle concentrations. While this demonstration does not include a sensing apparatus, the integration of such an optical detection system is relatively straightforward in optically transparent materials such as LN/PDMS, or where detection based on impedance is possible through the integration of suitable electrodes.[76] With such integration, highly focused SAW is ideally suited to deterministic sorting and microfluidic manipulation, potentially with specimens down to the scale of bacteria. Furthermore, proper control of the applied power on the FIDTs and the flow rate of the continuous input flow can also incorporate the acoustic streaming in the vicinity of the focused acoustic beam for particle capture and concentration in a continuous flow.

We have also demonstrated a device principle that is capable of similar sorting potential, though is able to accomplish this without respect to the mechanical properties or dimensions of the sorted objects. This device utilizes the newly demonstrated principle of acoustic micropumping, where the body force produced in a fluid body by a propagating acoustic wave results in an enhanced hydrostatic pressure differential when the acoustic beam is confined in a channel with similar dimensions to the beam width. The resulting fluid pumping can be used to selectively translate particles in a continuous flow in an analogous manner to that using the acoustic force on the particles directly; particles in the vicinity of the pumping channel outlet can be displaced within the fluid they are suspended in with the application of a pulsed SAW, which rapidly pumps fluid between co-flowing channels. Both of these methodologies have the potential to enhance single particle level sorting.

Advantageously, particle manipulation in such a device and system of the present invention can occur resulting from either (or both) embodiments where the force imparted on the particle or particle surfaces to translate particles with respect to the surrounding fluid media, or resulting from displacement of the fluid in which the particle is suspended.

Whilst there has been described in the foregoing description preferred embodiments of the present invention, it will be understood by those skilled in the technology concerned that many variations or modifications in details of design or construction may be made without departing from the present invention.

References

1 Barteneva, N. S., Ketman, K., Fasler-Kan, E., Potashnikova, D. & Vorobjev, I. A. Cell sorting in cancer research—Diminishing degree of cell heterogeneity. *Biochimica et Biophysica Acta (BBA)—Reviews on Cancer* 1836, 105-122 (2013).

2 Qi, W. et al. Sorting and identification of side population cells in the human cervical cancer cell line HeLa. *Cancer Cell Int* 14, 3 (2014).

3 Garner, D. L., Evans, K. M. & Seidel, G. E. in *Spermatogenesis* 279-295 (Springer, 2013).

4 Wang, B. L. et al. Microfluidic high-throughput culturing of single cells for selection based on extracellular metabolite production or consumption. *Nat. Biotechnol.* 32, 473-478 (2014).

5 Fung, E. et al. High-throughput screening of small molecules identifies hepcidin antagonists. *Mol. Pharmacol.* 83, 681-690 (2013).

6 Lab on a Chip Proc Natl Acad Sci USA Ultrasonics, F., and Frequency Control, IEEE Transactions on Journal of Micromechanics and Microengineering Segers, Tim & Versluis, M. Acoustic bubble sorting for ultrasound contrast agent enrichment. *Lab Chip* 14, 1705-1714 (2014).

7 Xia, Y. et al. in *Solid-State Sensors, Actuators and Microsystems (TRANSDUCERS)*, 2015 Transducers-2015 18th International Conference on. 1814-1817 (IEEE).

8 Alix-Panabières, C. & Pantel, K. Technologies for detection of circulating tumor cells: facts and vision. *Lab Chip* 14, 57-62 (2014).

9 Antfolk, M., Magnusson, C., Augustsson, P., Lilja, H. & Laurell, T. Acoustofluidic, label-free separation and simultaneous concentration of rare tumor cells from white blood cells. *Anal. Chem.* (2015).

10 Collins, D. J., Alan, T. & Neild, A. Particle separation using virtual deterministic lateral displacement (vDLD). *Lab Chip* 14, 1595-1603 (2014).

11 Kim, H., Lee, S., Lee, J.-h. & Kim, J. Integration of a microfluidic chip with a size-based cell bandpass filter for reliable isolation of single cells. *Lab Chip* (2015).

12 Ai, Y., Sanders, C. K. & Marrone, B. L. Separation of *Escherichia coli* bacteria from peripheral blood mononuclear cells using standing surface acoustic waves. *Anal. Chem.* 85, 9126-9134 (2013).

13 Zborowski, M. & Chalmers, J. J. Rare cell separation and analysis by magnetic sorting. *Anal. Chem.* 83, 8050-8056 (2011).

14 Hejazian, M., Li, W. & Nguyen, N.-T. Lab on a chip for continuous-flow magnetic cell separation. *Lab Chip* 15, 959-970 (2015).
15 Robert, D. et al. Cell sorting by endocytotic capacity in a microfluidic magnetophoresis device. *Lab Chip* 11, 1902-1910 (2011).
16 Laurell, T., Petersson, F. & Nilsson, A. Chip integrated strategies for acoustic separation and manipulation of cells and particles. *Chem. Soc. Rev.* 36, 492-506 (2007).
17 Nam, J., Lim, H., Kim, C., Kang, J. Y. & Shin, S. Density-dependent separation of encapsulated cells in a microfluidic channel by using a standing surface acoustic wave. *Biomicrofluidics* 6, 024120 (2012).
18 Schor, A. & Buie, C. in *Solid-State Sensors, Actuators and Microsystems (TRANSDUCERS)*, 2015 Transducers-2015 18th International Conference on. 1617-1620 (IEEE).
19 McFaul, S. M., Lin, B. K. & Ma, H. Cell separation based on size and deformability using microfluidic funnel ratchets. *Lab Chip* 12, 2369-2376 (2012).
20 Wu, T.-H. et al. Pulsed laser triggered high speed microfluidic fluorescence activated cell sorter. *Lab Chip* 12, 1378-1383 (2012).
21 Shaker, M., Colella, L., Caselli, F., Bisegna, P. & Renaud, P. An impedance-based flow microcytometer for single cell morphology discrimination. *Lab Chip* 14, 2548-2555 (2014).
22 Song, H. et al. A microfluidic impedance flow cytometer for identification of differentiation state of stem cells. *Lab Chip* 13, 2300-2310 (2013).
23 Bonner, W., Hulett, H., Sweet, R. & Herzenberg, L. Fluorescence activated cell sorting. *Rev. Sci. Instrum.* 43, 404-409 (1972).
24 Guo, M. T., Rotem, A., Heyman, J. A. & Weitz, D. A. Droplet microfluidics for high-throughput biological assays. *Lab Chip* 12, 2146-2155 (2012).
25 Collins, D. J., Neild, A., deMello, A., Liu, A.-Q. & Ai, Y. The Poisson distribution and beyond: methods for microfluidic droplet production and single cell encapsulation. *Lab on a Chip* 15, 3439-3459 (2015).
26 Chen, Y. et al. Pulsed laser activated cell sorting with three dimensional sheathless inertial focusing. *small* 10, 1746-1751 (2014).
27 Nan, L., Jiang, Z. & Wei, X. Emerging microfluidic devices for cell lysis: a review. *Lab Chip* 14, 1060-1073 (2014).
28 Wiklund, M. Acoustofluidics 12: Biocompatibility and cell viability in microfluidic acoustic resonators. *Lab Chip* 12, 2018-2028 (2012).
29 Hammarström, B. et al. Non-contact acoustic cell trapping in disposable glass capillaries. *Lab Chip* 10, 2251-2257 (2010).
30 Wiklund, M. et al. Ultrasound-induced cell-cell interaction studies in a multi-well microplate. *Micromachines* 5, 27-49 (2014).
31 Sivanantha, N. et al. Characterization of adhesive properties of red blood cells using surface acoustic wave induced flows for rapid diagnostics. *Applied Physics Letters* 105, 103704 (2014).
32 Ding, X. et al. On-chip manipulation of single microparticles, cells, and organisms using surface acoustic waves. *Proc. Natl. Acad. Sci. U.S.A.* 109, 11105-11109 (2012).
33 Leibacher, I., Hahn, P. & Dual, J. Acoustophoretic cell and particle trapping on microfluidic sharp edges. *Microfluidics and Nanofluidics*, 1-11 (2015).
34 Yeo, L. Y. & Friend, J. R. Surface acoustic wave microfluidics. *Annu. Rev. Fluid Mech.* 46, 379-406 (2014).
35 Jakobsson, O., Grenvall, C., Nordin, M., Evander, M. & Laurell, T. Acoustic actuated fluorescence activated sorting of microparticles. *Lab Chip* 14, 1943-1950 (2014).
36 Nawaz, A. A. et al. Acoustofluidic Fluorescence Activated Cell Sorter. *Anal. Chem.* 87, 12051-12058 (2015).
37 Ren, L. et al. A high-throughput acoustic cell sorter. *Lab Chip* 15, 3870-3879 (2015).
38 Ding, X. et al. Standing surface acoustic wave (SSAW) based multichannel cell sorting. *Lab Chip* 12, 4228-4231 (2012).
39 Destgeer, G. et al. Microchannel Anechoic Corner for Size-Selective Separation and Medium Exchange via Traveling Surface Acoustic Waves. *Anal. Chem.* 87, 4627-4632 (2015).
40 Collins, D. J. et al. Atomization off thin water films generated by high-frequency substrate wave vibrations. *Phys. Rev. E* 86, 056312 (2012).
41 Destgeer, G. et al. Adjustable, rapidly switching microfluidic gradient generation using focused travelling surface acoustic waves. *Appl. Phys. Lett.* 104, 023506 (2014).
42 Destgeer, G., Ha, B. H., Jung, J. H. & Sung, H. J. Submicron separation of microspheres via travelling surface acoustic waves. *Lab Chip* 14, 4665-4672 (2014).
43 Bourquin, Y. & Cooper, J. M. Swimming Using Surface Acoustic Waves. *PloS one* 8, e42686 (2013).
44 Behrens, J. et al. Microscale anechoic architecture: acoustic diffusers for ultra low power microparticle separation via traveling surface acoustic waves. *Lab Chip* 15, 43-46 (2015).
45 Shilton, R. J., Travagliati, M., Beltram, F. & Cecchini, M. Nanoliter—droplet acoustic streaming via ultra high frequency surface acoustic waves. *Adv. Mater.* 26, 4941-4946 (2014).
46 Franke, T., Braunmliller, S., Schmid, L., Wixforth, A. & Weitz, D. Surface acoustic wave actuated cell sorting (SAWACS). *Lab Chip* 10, 789-794 (2010).
47 Schmid, L., Weitz, D. A. & Franke, T. Sorting drops and cells with acoustics: acoustic microfluidic fluorescence-activated cell sorter. *Lab Chip* 14, 3710-3718 (2014).
48 Skowronek, V., Rambach, R. W., Schmid, L., Haase, K. & Franke, T. Particle deflection in a poly (dimethylsiloxane) microchannel using a propagating surface acoustic wave: size and frequency dependence. *Analytical chemistry* 85, 9955-9959 (2013).
49 Bourquin, Y., Wilson, R., Zhang, Y., Reboud, J. & Cooper, J. M. Phononic crystals for shaping fluids. *Adv. Mater.* 23, 1458-1462 (2011).
50 Cooper, J. Use of phononic materials in microfluidic & lab-on-a-chip manipulations. *J. Acoust. Soc. Am.* 131, 3303-3303 (2012).
51 Reboud, J. et al. Shaping acoustic fields as a toolset for microfluidic manipulations in diagnostic technologies. *Proc. Natl. Acad. Sci. U.S.A.* 109, 15162-15167 (2012).
52 Reboud, J. et al. Nebulisation on a disposable array structured with phononic lattices. *Lab Chip* 12, 1268-1273 (2012).
53 Salehi-Reyhani, A. et al. Chemical-Free Lysis and Fractionation of Cells by Use of Surface Acoustic Waves for Sensitive Protein Assays. *Anal. Chem.* 87, 2161-2169 (2015).
54 Witte, C., Reboud, J., Wilson, R., Cooper, J. & Neale, S. Microfluidic resonant cavities enable acoustophoresis on a disposable superstrate. *Lab Chip* 14, 4277-4283 (2014).

55 Dentry, M. B., Friend, J. R. & Yeo, L. Y. Continuous flow actuation between external reservoirs in small-scale devices driven by surface acoustic waves. *Lab Chip* 14, 750-758 (2014).
56 Collins, D. J., Alan, T., Helmerson, K. & Neild, A. Surface acoustic waves for on-demand production of picoliter droplets and particle encapsulation. *Lab Chip* 13, 3225-3231 (2013).
57 Collins, D. J., Alan, T. & Neild, A. The particle valve: On-demand particle trapping, filtering, and release from a microfabricated polydimethylsiloxane membrane using surface acoustic waves. *Appl. Phys. Lett.* 105, 033509 (2014).
58 Ai, Y. & Marrone, B. L. Droplet translocation by focused surface acoustic waves. *Microfluid. Nanofluid.* 13, 715-722 (2012).
59 Sesen, M., Alan, T. & Neild, A. Microfluidic on-demand droplet merging using surface acoustic waves. *Lab Chip* (2014).
60 Settnes, M. & Bruus, H. Forces acting on a small particle in an acoustical field in a viscous fluid. *Phys. Rev. E* 85, 016327 (2012).
61 King, L. V. in *Proceedings of the Royal Society of London A: Mathematical, Physical and Engineering Sciences.* 212-240 (The Royal Society).
62 Hasegawa, T. & Yosioka, K. Acoustic—Radiation Force on a Solid Elastic Sphere. *J. Acoust. Soc. Am.* 46, 1139-1143 (1969).
63 Qi, Q. & Brereton, G. J. Mechanisms of removal of micron-sized particles by high-frequency ultrasonic waves. *IEEE Trans. Ultrason. Ferroelectr. Freq. Control* 42, 619-629 (1995).
64 Ma, Z., Collins, D. J. & Ai, Y. A detachable acoustofluidic system for particle separation via a travelling surface acoustic wave. *Anal. Chem.* 88, 5316-5323 (2016).
65 Skowronek, V., Rambach, R. W., Schmid, L., Haase, K. & Franke, T. Particle deflection in a poly(dimethylsiloxane) microchannel using a propagating surface acoustic wave: size and frequency dependence. *Anal. Chem.* 85, 9955-9959, doi:10.1021/ac402607p (2013).
66 Dentry, M. B., Yeo, L. Y. & Friend, J. R. Frequency effects on the scale and behavior of acoustic streaming. *Phys. Rev. E* 89, 013203 (2014).
67 Nyborg, W. L. Acoustic streaming due to attenuated plane waves. *J. Acoust. Soc. Am.* 25, 68-75 (1953).
68 Collins, D. J., Neild, A. & Ai, Y. Highly focused high-frequency travelling surface acoustic waves (SAW) for rapid single-particle sorting. *Lab Chip* 16, 471-479 (2016).
69 Destgeer, G., Lee, K. H., Jung, J. H., Alazzam, A. & Sung, H. J. Continuous separation of particles in a PDMS microfluidic channel via travelling surface acoustic waves (TSAW). *Lab Chip* 13, 4210-4216 (2013).
70 Collins, D. J., Ma, Z. & Ai, Y. Highly Localized Acoustic Streaming and Size-Selective Submicrometer Particle Concentration Using High Frequency Microscale Focused Acoustic Fields. *Anal. Chem.* 88, 5513-5522 (2016).
71 Holm, A., Stirzer, Q., Xu, Y. & Weigel, R. Investigation of surface acoustic waves on LiNbO 3, quartz, and LiTaO 3 by laser probing. *Microelectron. Eng.* 31, 123-127 (1996).
72 Shilton, R., Tan, M. K., Yeo, L. Y. & Friend, J. R. Particle concentration and mixing in microdrops driven by focused surface acoustic waves. *J. Appl. Phys.* 104, 014910 (2008).
73 Basu, A. S. Droplet morphometry and velocimetry (DMV): a video processing software for time-resolved, label-free tracking of droplet parameters. *Lab Chip* 13, 1892-1901 (2013).
74 Langelier, S. M., Yeo, L. Y. & Friend, J. UV epoxy bonding for enhanced SAW transmission and microscale acoustofluidic integration. *Lab Chip* 12, 2970-2976 (2012).
75 Gor'Kov, L. in *Soviet Physics Doklady.* 773.
76 Schoendube, J., Wright, D., Zengerle, R. & Koltay, P. Single-cell printing based on impedance detection. *Biomicrofluidics* 9, 014117 (2015).

The invention claimed is:
1. A microfluidic device for manipulating a particle in a fluid suspension, the device comprising:
 (a) a substrate;
 (b) a first channel defined in the substrate, the first channel having an inlet for receiving the fluid suspension and an outlet for discharging the fluid suspension; and
 (c) an acoustic source configured to generate and deliver a single travelling surface acoustic wave transverse the flow of the fluid suspension in the channel and configured to propagate into the solution confined within the channel, wherein the acoustic source is a single interdigital transducer (IDT), and the IDT comprises a plurality of concentric arcs having a tapered end directed at the channel, and the tapered end has an aperture of between 4 µm and 150 µm.
2. The device according to claim 1, wherein the aperture is 56 µm.
3. The device according to claim 1, further comprising a second channel defined in the substrate, the second channel having an inlet for receiving a fluid and an outlet for discharging the fluid, the second channel is disposed intermediate the first channel and the acoustic source,
 wherein the first and second channels are disposed alongside each other and the direction of flow of fluids in the first and second channels are in the same direction, the first and second channels are connected in fluid communication by a pumping channel disposed between the first and second channels, the pumping channel connecting the first and second channels is disposed intermediate the inlets and outlets of both the first and second channels, and the acoustic source is disposed adjacent the second channel to generate and deliver the travelling surface acoustic wave transverse the flow of the fluid from the second channel to the first channel through the pumping channel, the flow of the fluid from the pumping channel to the first channel manipulates the particle in the fluid suspension in the first channel.
4. The device according to claim 3, wherein each of the first and second channels has a width of about 120 µm and a height of about 25 µm.
5. The device according to claim 4, wherein the width of the second channel adjacent the acoustic source is narrower than the width of the second channel at the inlet and outlet.
6. The device according to claim 5, wherein the width of the second channel adjacent the acoustic source is about 20 µm.
7. The device according to claim 3, wherein the pumping channel has a width of about 20 µm and a length of about 170 µm.
8. The device according to claim 3, wherein the inlet of each of the first and second channel is in fluid communication with a pump.

9. The device according to claim 1, wherein the substrate is a piezoelectric substrate selected from the group consisting of: lithium niobate, lithium tantalite, and lanthanum gallium silicate.

10. The device according to claim 1, wherein the surface acoustic wave has an average frequency of between 100 MHz and 1000 MHz.

11. The device according to claim 1, wherein the first channel comprises a plurality of outlet channels.

12. A method for manipulating a particle in a fluid suspension, the method comprising:
(a) introducing the fluid suspension along a first channel; and
(b) using an acoustic source to generate a highly focused travelling surface acoustic wave transverse the flow of the fluid suspension in the first channel to manipulate the particle travelling in the first channel, wherein the acoustic source is an interdigital transducer (IDT), the IDT comprises a plurality of concentric arcs having a tapered end directed at the channel, and the tapered end has an aperture of between 4 µm and 150 µm.

13. The method according to claim 12, wherein the aperture is 56 µm.

14. The method according to claim 12, further comprising:
(a) introducing a fluid along a second channel, the second channel disposed alongside the first channel, the fluids in both channel travelling in the same direction, the second channel intermediate the first channel and the acoustic source;
(b) connecting in fluid communication the second channel to the first channel with a pumping channel, the pumping channel disposed between the first and second channels, and intermediate the inlets and outlets of both the first and second channels, wherein the acoustic source is disposed adjacent the second channel on the opposing side of the first channel to generate and deliver the travelling surface acoustic wave transverse the flow of the fluid in the second channel and to pump the fluid from the second channel to the first channel through the pumping channel, and manipulating the particle in the fluid suspension in the first channel with the flow of the fluid from the pumping channel.

15. The method according to claim 14, wherein width of the second channel adjacent the acoustic source is narrower than the width of the second channel at the inlet and outlet, thereby constricting the flow of the fluid in the second channel adjacent the acoustic source.

16. The method according to claim 15, wherein the width of the second channel adjacent the acoustic source is about 20 µm.

17. The method according to claim 14, wherein the pumping channel has a width of about 20 µm and a length of about 170 µm.

18. The method according to claim 14, wherein the inlet of each of the first and second channel is in fluid communication with a pump for pumping fluid through the channels.

19. The method according to claim 14 , wherein the surface acoustic wave has an average frequency of between 100 MHz and 1000 MHz.

20. An interdigital transducer comprising a plurality of concentric circular arcs having a tapered end, wherein the tapered end has an aperture of between 4 µm and 150 µm and wherein the interdigital transducer is configured to generate a travelling the surface acoustic wave placed adjacent a microfluidic channel to deliver the wave transverse the flow of the fluid suspension in the channel.

* * * * *